United States Patent
Ohuchi

(10) Patent No.: US 8,389,413 B2
(45) Date of Patent: Mar. 5, 2013

(54) METHOD OF MANUFACTURING SEMICONDUCTOR DEVICE

(75) Inventor: Masahiko Ohuchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 85 days.

(21) Appl. No.: 12/929,897

(22) Filed: Feb. 23, 2011

(65) Prior Publication Data
US 2011/0207330 A1    Aug. 25, 2011

(30) Foreign Application Priority Data
Feb. 24, 2010   (JP) .................... 2010-039455

(51) Int. Cl.
*H01L 21/00*   (2006.01)

(52) U.S. Cl. ................. 438/703; 257/E21.214

(58) Field of Classification Search ........... 438/703, 438/947, 702, 717, 723–725; 257/E21.214
See application file for complete search history.

(56) References Cited

U.S. PATENT DOCUMENTS

| 6,063,688 | A | 5/2000 | Doyle et al. |
| 6,225,201 | B1 * | 5/2001 | Gardner et al. ............... 438/585 |
| 6,362,057 | B1 * | 3/2002 | Taylor et al. ................. 438/286 |
| 7,601,647 | B2 | 10/2009 | Jeon et al. |
| 2008/0017992 | A1 | 1/2008 | Kito et al. |

FOREIGN PATENT DOCUMENTS

| JP | 2008-27978 A | 2/2008 |
| JP | 2008-193098 A | 8/2008 |

* cited by examiner

*Primary Examiner* — Richard A. Booth
(74) *Attorney, Agent, or Firm* — McGinn IP Law Group, PLLC

(57) ABSTRACT

A sidewall core that is slimmed is formed in a memory cell array area by patterning a polysilicon layer formed over a silicon nitride layer. A silicon oxide layer that at least covers side surfaces of the sidewall core and the polysilicon layer are sequentially formed and an embedded hard mask is formed by etching back the polysilicon layer. Thereafter, the silicon nitride layer within the memory cell array area that does not overlap with the sidewall core or the embedded hard mask and the silicon nitride layer within a peripheral circuit area that overlaps with a positioning monitor mark are exposed by etching the silicon oxide layer, and then the silicon nitride layer that is to be etched is patterned.

20 Claims, 31 Drawing Sheets

METHOD OF MANUFACTURING SEMICONDUCTOR DEVICE

TECHNICAL FIELD

1. Field of the Invention

The present invention relates to a method of manufacturing a semiconductor device, and more particularly relates to a method of manufacturing a semiconductor device including a step of forming a fine pattern of a size smaller than the resolution limit of lithography by using a sidewall spacer as a mask.

2. Description of Related Art

Conventionally, a photolithography technique typically involved etching an underlying silicon substrate or a silicon oxide layer using a photoresist pattern as a mask obtained by exposure and development through a photomask. However, as the patterns have become finer over the course of time, types of the light sources used in the exposure have changed and an etching resistance of the photoresist suited to such light sources has reduced. Therefore, the following technique is frequently used recently for pattern formation. That is, a pattern is once transferred onto an underlying film, for example, a silicon nitride film, having a thickness that is relatively thin but thick enough to enable the photoresist to endure. Thereafter, a layer that originally needs to be processed, for example, a silicon oxide film, which is a film beneath the silicon nitride film, is etched using the silicon nitride film as a mask, thereby forming a pattern. A silicon nitride film patterned in this manner is called "hard mask".

In recent years, demands for downsizing and higher density of semiconductor memories or the like have surpassed the speed of development of lithography techniques represented by, for example, exposure devices or photoresist materials. As a result, methods of forming a pattern of a size smaller than the resolution limit of lithography are drawing attention. For example, U.S. Pat. No. 6,063,688 discloses a technique of forming a fine pattern of a size smaller than the resolution limit of lithography by etching a layer beneath sidewall spacers using the sidewall spacers as a hard mask.

Regarding the method of forming a pattern using sidewall spacers, the following points should be noted with respect to the sidewall spacers. For example, (1) the method described above is suitable for forming a pattern of a fixed width determined by a film thickness of the sidewall spacers; however, because the method is not suitable for forming a pattern of an arbitrary size and shape, a separate processing step is required for forming such a pattern having an arbitrary size and shape. (2) Because sidewall spacers are formed along side surfaces of a core pattern formed on a semiconductor substrate, irrespective of whether the formed pattern is an island pattern or an opening pattern, and thus the sidewall spacers are formed inevitably in a loop-shape. Therefore, to change the loop-shaped pattern formed using the sidewall spacers to a desired pattern such as a line and space pattern, it is necessary to isolate a line pattern or a space pattern by cutting a portion of the loop-shaped pattern.

In the method disclosed in U.S. Pat. No. 6,063,688, a surface of a substrate other than a channel region in which fine sidewall spacers are formed is covered with a photoresist, and the substrate is etched using the photoresist and the sidewall spacers as masks. As a result, a fine trench pattern is formed only in the channel region on the substrate.

In the method disclosed in U.S. Pat. No. 6,063,688, the region other than the channel region is covered with the resist, and thus formation of unnecessary trenches is prevented. Further, the space pattern can be isolated while end portions of line and end patterns in the channel region are not joined.

Meanwhile, Japanese Patent Application Laid-open No. 2008-027978 discloses a method of forming a fine pattern of a size smaller than the resolution limit of lithography and forming a pattern of an arbitrary size using sidewall spacers at the same time.

In the method disclosed in Japanese Patent Application Laid-open No. 2008-027978, a first core pattern for forming sidewall spacers and a second core pattern for forming a pattern of an arbitrary size are formed on a semiconductor substrate in a single photolithography process and the sidewall spacers are, respectively, arranged on side surfaces of the first core pattern and the second core pattern. Thereafter, the first core pattern is selectively removed while the second core pattern is left on the semiconductor substrate and used as a hard mask, thereby forming a hard mask of an arbitrary size.

Furthermore, Japanese Patent Application Laid-open No. 2008-193098 discloses a method of forming a fine pattern of a size smaller than the resolution limit of lithography and a pattern of an arbitrary size by simultaneously forming a high density pattern and a low density pattern in a mask pattern forming sidewall spacers.

However, in the method disclosed in U.S. Pat. No. 6,063,688, various problems are likely to occur due to applying, exposing, and developing a photoresist on the surface of a substrate in a state where sidewall spacers are formed. For example, because fine irregularities are formed due to the presence of the sidewall spacers on a surface having the photoresist applied thereon, it is necessary to apply a resist after making the surface of an underlying layer flat by using a multi-layer resist although the pattern formed using the resist is not fine. Therefore, its manufacturing cost increases as compared to a case where a single-layer resist is used. Further, the semiconductor substrate has considerably fine and local irregularities and, on the other hand, its circumference is substantially smooth without having any patterns. Therefore, when applying a resist, an organic anti-reflective film or the like, variations in the film thickness are likely to occur, and the resist, the organic anti-reflective film or the like cannot be applied uniformly on the semiconductor substrate.

In Japanese Patent Application Laid-open No. 2008-027978, the hard mask pattern of an arbitrary size is formed of the second core pattern and the sidewall spacers formed on the side surfaces of the second core pattern. Therefore, an end portion position and a pattern width of the hard mask pattern are affected by variations in thickness of films for the sidewall spacers during the formation thereof and variations in etching back during formation of the sidewall spacers in addition to positioning misalignment in the photolithography process, variations in exposure and development, and variations in etching. Accordingly, there has been a problem that the pattern cannot be formed at a desired position or in a desired size. Particularly, when a positioning monitor mark is formed as a pattern of an arbitrary size, there has been a problem that monitoring accuracy is lowered significantly. Furthermore, in the method disclosed in Japanese Patent Application Laid-open No. 2008-027978, it is not possible to cut and isolate a part of a loop-shaped portion of the line pattern or the space pattern.

In Japanese Patent Application Laid-open No. 2008-193098, it is necessary to use a specific etching technique to obtain a desired shape in the high density pattern area and the low density pattern area while etching a buffer layer by simultaneously forming the high density pattern and the low density pattern. In this respect, it is difficult to control pattern shapes. Furthermore, also in the technique disclosed in Japanese Patent Application Laid-open No. 2008-193098, it is not possible to cut and isolate a part of a loop-shaped portion of the line pattern or the space pattern.

SUMMARY

In one embodiment, there is provided a method of manufacturing a semiconductor device comprising: forming a first layer on a member to be etched having first and second areas, the first area including a processing area and a non-processed area; forming a sidewall core in the first area by patterning the first layer; forming a second layer that at least covers side surfaces of the sidewall core; forming a third layer over the second layer; forming an embedded hard mask that at least covers side surfaces of the second layer by etching back the third layer; exposing the member to be etched in an area that neither the sidewall core nor the embedded hard mask is formed within the first area and the member to be etched in an area that a second pattern is to be formed within the second area by etching the second layer; and forming a first pattern in the processing area of the first area and the second pattern in the second area by selectively removing the member to be etched having been exposed, wherein the exposing the member to be etched is performed by using a mask layer that covers the non-processed area of the first area and an area other than the area that the second pattern is to be formed within the second area and exposes the processing area of the first area and the area that the second pattern is to be formed within the second area.

The present invention can provide a process of forming a mask pattern in which a fine pattern of a size smaller than the resolution limit of lithography by using sidewall spacers and a pattern of an arbitrary size are mixed.

BRIEF DESCRIPTION OF THE DRAWINGS

The above features and advantages of the present invention will be more apparent from the following description of certain preferred embodiments taken in conjunction with the accompanying drawings, in which:

FIG. 2A is a cross sectional view taken along a direction of a word line WL, and FIG. 2B is a cross sectional view taken along a direction of a bit line BL;

FIG. 3A is a plan view, FIG. 3B is a cross sectional view taken along an arrow A-A' of FIG. 3A, and FIG. 3C is a cross sectional view taken along an arrow B-B' of FIG. 3A;

FIG. 4A is a plan view, FIG. 4B is a cross sectional view taken along an arrow A-A' of FIG. 4A, and FIG. 4C is a cross sectional view taken along an arrow B-B' of FIG. 4A;

FIG. 5A is a plan view, FIG. 5B is a cross sectional view taken along an arrow A-A' of FIG. 5A, and FIG. 5C is a cross sectional view taken along an arrow B-B' of FIG. 5A;

FIG. 6A is a plan view, and FIG. 6B is a cross sectional view;

FIG. 7A is a plan view, and FIG. 7B is a cross sectional view;

FIG. 8A is a plan view, and FIG. 8B is a cross sectional view;

FIG. 9A is a plan view, and FIG. 9B is a cross sectional view;

FIG. 10A is a plan view, and FIG. 10B is a cross sectional view;

FIG. 11A is a plan view, and FIG. 11B is a cross sectional view;

FIG. 12A is a plan view, and FIG. 12B is a cross sectional view;

FIG. 13A is a plan view, and FIG. 13B is a cross sectional view;

FIG. 14A is a plan view, and FIG. 14B is a cross sectional view;

FIG. 15A is a plan view, and FIG. 15B is a cross sectional view;

FIG. 16A is a plan view, and FIG. 16B is a cross sectional view;

FIG. 17A is a plan view, and FIG. 17B is a cross sectional view;

FIG. 18A is a plan view, and FIG. 18B is a cross sectional view;

FIG. 19A is a plan view, and FIG. 19B is a cross sectional view;

FIG. 20A is a plan view, and FIG. 20B is a cross sectional view;

FIG. 21A is a plan view, and FIG. 21B is a cross sectional view;

FIG. 22A is a plan view, and FIG. 22B is a cross sectional view;

FIG. 23A is a plan view, and FIG. 23B is a cross sectional view;

FIG. 24A is a plan view, and FIG. 24B is a cross sectional view;

FIG. 25A is a plan view, and FIG. 25B is a cross sectional view;

FIG. 26A is a plan view, and FIG. 26B is a cross sectional view;

FIG. 27A is a plan view, and FIG. 27B is a cross sectional view;

FIG. 28A is a plan view, and FIG. 28B is a cross sectional view;

FIG. 29A is a plan view, and FIG. 29B is a cross sectional view;

FIG. 30A is a plan view, and FIG. 30B is a cross sectional view; FIG. 31A is a plan view, and FIG. 31B is a cross sectional view.

DETAILED DESCRIPTION OF THE EMBODIMENTS

Preferred embodiments of the present invention will be explained below in detail with reference to the accompanying drawings.

A PRAM (Phase Change RAM) device is briefly explained first, as an example of a semiconductor device suitable for applying a manufacturing method according to the present invention.

Figure 1:
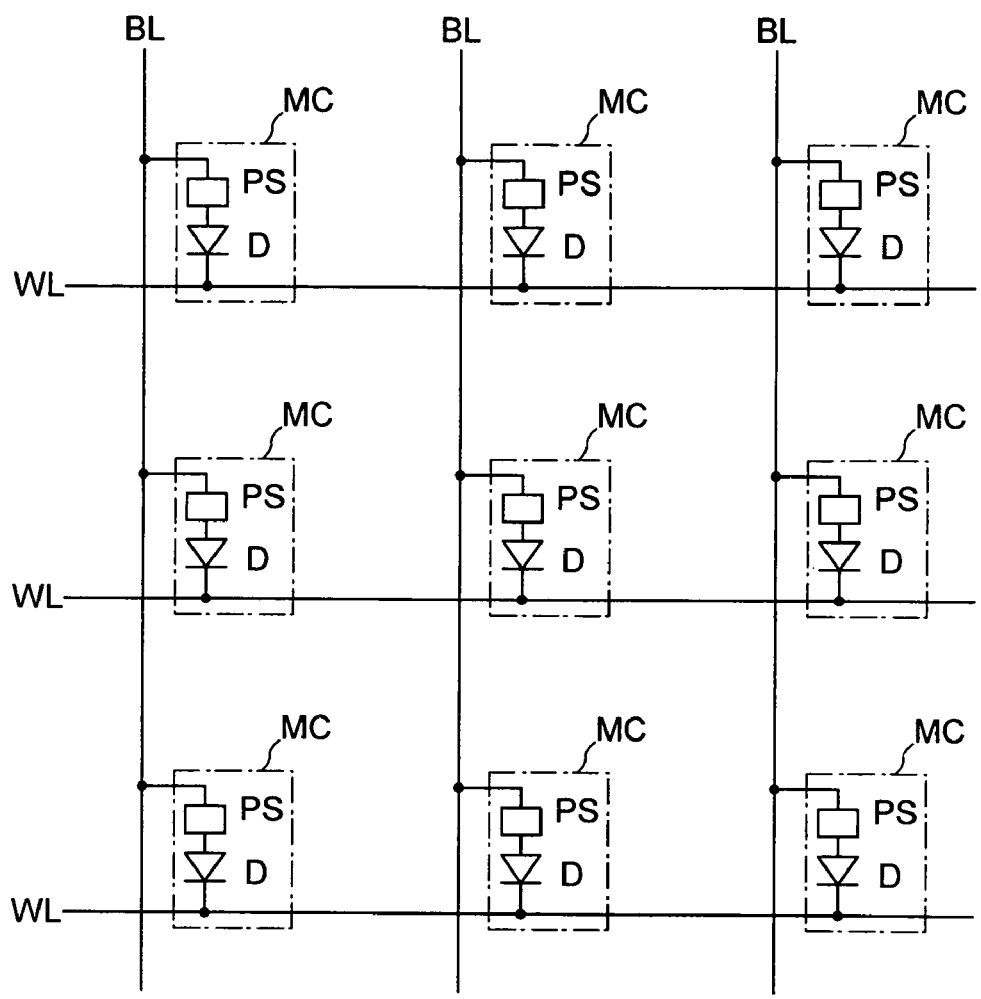
FIG. 1 is a circuit diagram showing an example of a memory cell array of a PRAM, which is an example of a semiconductor device suitable for applying a semiconductor device manufacturing method according to the present invention.

FIG. 1 is a circuit diagram showing an example of a memory cell array of a PRAM.

As shown in FIG. 1, the memory cell array of the PRAM includes a plurality of word lines WL and a plurality of bit lines BL. The word lines WL and the bit lines BL orthogonally intersect with each other and a memory cell MC is provided at each node. Each of the memory cells MC includes a series circuit formed of a phase-change material device PS and a diode D. One end of the phase-change material device PS is connected to a corresponding bit line BL while one end of the diode D is connected to a corresponding word line WL.

The phase-change material device PS can have two stable states that have different electrical resistances and can make a mutually reversible transition therebetween. By detecting the electrical resistances of the phase-change material device PS, programmed information can be read. When the memory cell MC is not selected, the diode D is reverse-biased and controlled to be in a non-conductive state. When the memory cell MC is selected, the diode D is controlled to be in a conductive state by controlling the corresponding bit line BL to a high potential and the corresponding word line WL to a low potential. As a result, the electrical resistances of the phase-change material device PS are detected by causing a current to flow through the phase-change material device PS.

Figure 2A:
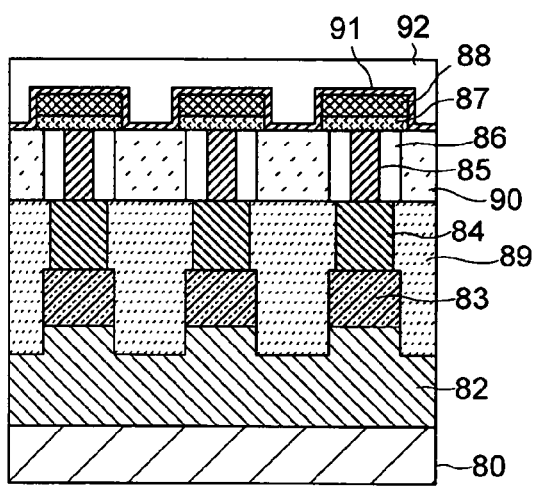
FIGS. 2A and 2B are side cross sectional views for schematically showing a configuration of a PRAM, where
Figure 2B:
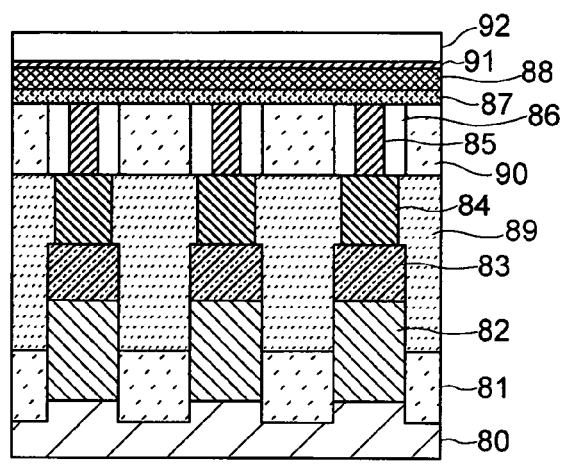

FIGS. 2A and 2B are side cross sectional views of the PRAM memory cell, respectively taken along a direction of a word line WL and a bit line BL. FIGS. 2A and 2B respectively show a three-bit memory cell.

As shown in FIGS. 2A and 2B, an N-type impurity diffusion layer 82 formed on a P-type silicon substrate 80 forms the word lines WL. Adjacent word lines WL are isolated from each other by a silicon oxide layer 81. The N-type impurity diffusion layer 82 and a P-type impurity diffusion layer 83 are formed on silicon pillars, which are formed on the silicon substrate 80 and isolated from each other by an insulating layer 89, and constitute the diodes D. A phase-change material layer 87 is sandwiched between heater electrodes 85 and upper electrodes 88 and constitutes the phase-change material devices PS. The phase-change material layer 87 is connected to each of the diodes D in a series via a metal plug 84. The upper electrode 88 extends in a direction orthogonal to the word lines WL and functions as the bit lines. BL that are commonly connected to a plurality of memory cells. The phase-change material layer 87 is covered with an interlayer insulating film 92 via an anti-deterioration protective insulating film 91. The heater electrode 85 is formed with a diameter restricted to be small by an insulating layer 86 formed on inner walls of an opening formed in an insulating layer 90, thus realizing a high current density.

A manufacturing process of the exemplified PRAM is briefly explained below.

Figure 3A:
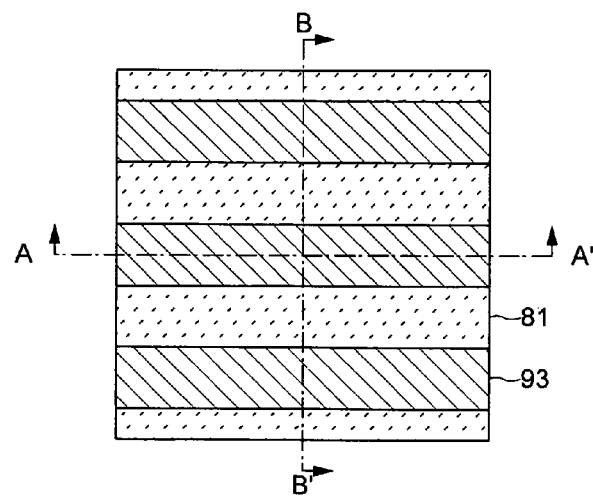
FIGS. 3A 3B and 3C are diagrams showing a manufacturing process of the exemplified PRAM, where
Figure 3B:
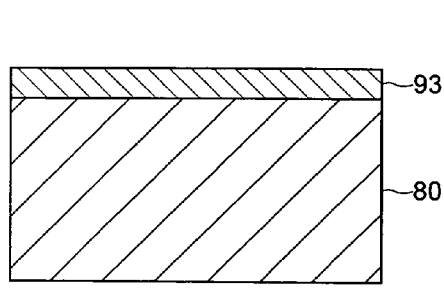
Figure 3C:
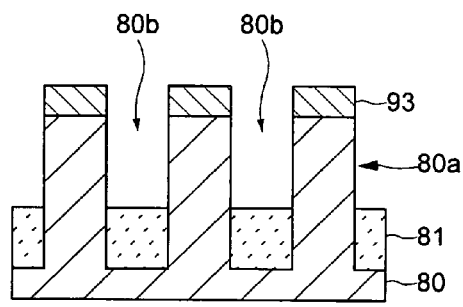
Figure 4A:
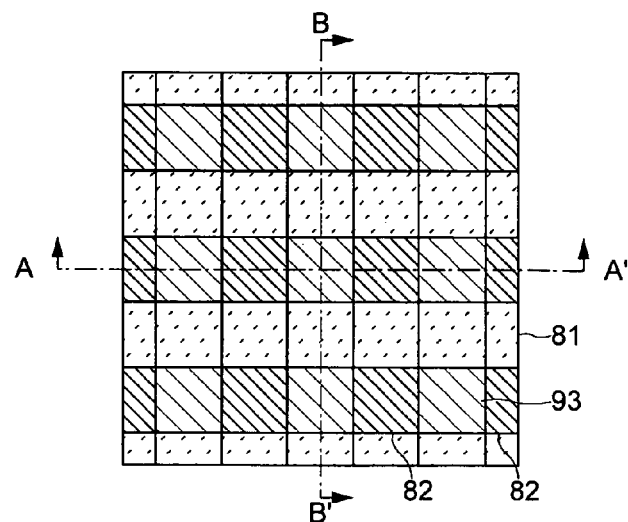
FIGS. 4A 4B and 4C are diagrams showing a manufacturing process of the exemplified PRAM, where
Figure 4B:
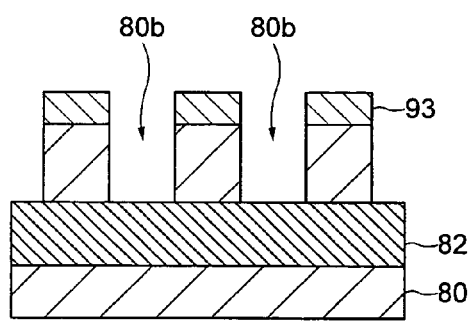
Figure 4C:
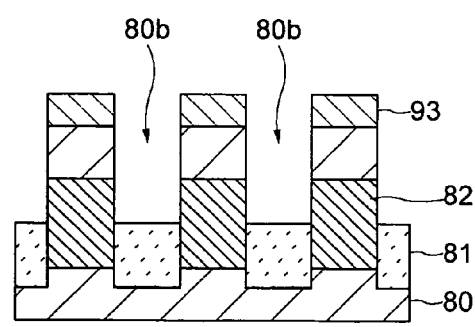
Figure 5A:
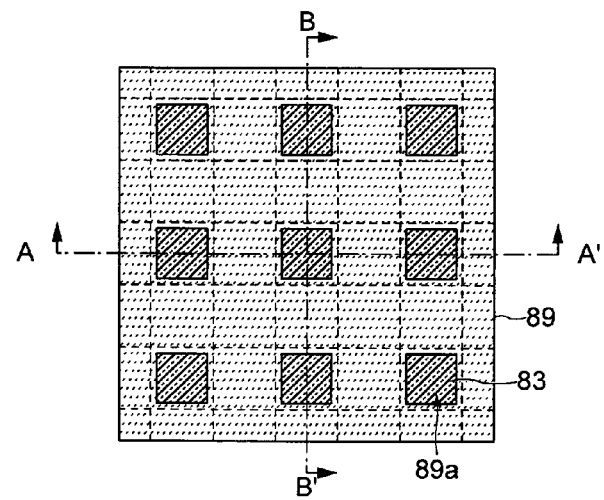
FIGS. 5A 5B and 5C are diagrams showing a manufacturing process of the exemplified PRAM, where
Figure 5B:
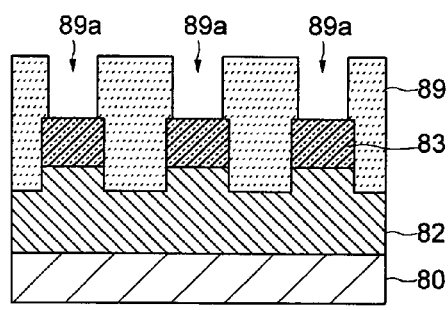
Figure 5C:
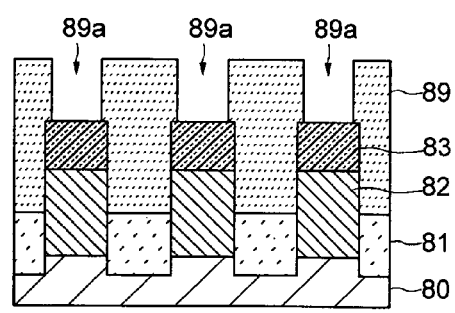

FIGS. 3 to 5 show manufacturing processes of the exemplified PRAM, where FIGS. 3A, 4A, and 5A are plan views, FIGS. 3B, 4B, and 5B are cross sectional views taken along an arrow A-A' of respective drawings, and FIGS. 3C, 4C, and 5C are cross sectional views taken along an arrow B-B' of respective drawings.

In manufacturing a PRAM, a P-type silicon substrate is prepared first. Thereafter, as shown in FIGS. 3A to 3C, isolation trenches 80b extending in a Y direction are formed by etching the silicon substrate 80 for 200 nanometers (nm) using an amorphous carbon hard mask 93. In a plane pattern of the amorphous carbon hard mask 93 that forms the isolation trenches 80b, space patterns (light pattern portions) extending in the Y direction and have a width of 30 nm, are arranged at a pitch of 60 nm in an X direction. Accordingly, the isolation trenches 80b can be formed on a surface of the silicon substrate 80 in a memory cell array area. On the other hand, no trench is formed in a peripheral circuit area (not shown) other than the memory cell array area except for a part of the peripheral circuit area in which a positioning monitor mark or the like is formed, and thus the surface of the silicon substrate 80 is covered with the amorphous carbon hard mask 93, forming a dark pattern portion. A method of forming the hard mask is described later in detail.

Next, a thick silicon oxide layer is formed using a CVD method to fill the isolation trenches 80b. Thereafter, the thick silicon oxide layer is etched back to form the silicon oxide layer 81 for isolating the word lines WL.

Next, a hard mask pattern is formed in which the space patterns, which are orthogonal to the isolation trenches 80b, extend in the X direction and have a width of 30 nm, are arranged at a pitch of 60 nm in the Y direction. The amorphous carbon hard mask 93 is etched using the hard mask pattern and an amorphous carbon hard mask pattern array of island-shape having a size of 30 nm×30 nm is obtained as shown in FIGS. 4A to 4C. Silicon pillars 80a are formed by etching the silicon substrate 80 by, for example, 100 nm using the amorphous carbon hard mask 93.

N-type impurities such as phosphorus are then ion-implanted into the silicon substrate 80. The phosphorus implanted into the surface of the silicon substrate 80 to which a bottom of each trench is exposed is activated by heat treatment performed after the ion-implantation, and diffused in the silicon substrate 80 to reach an area below the silicon pillars 80a. As a result, the N-type impurity diffusion layer 82, that is, the word line WL extending in the Y direction, is formed.

Next, as shown in FIGS. 5A to 5C, openings 89a for metal plugs are formed after the insulating layer 89 is formed on the surface of the silicon substrate 80. The P-type impurity diffusion layer 83 is formed by introducing P-type impurities in the silicon pillars 80a, and as a result, PN diodes D are formed. A plane pattern of the hard mask, which is used for forming the openings 89a, having a size of, for example, 24 nm×24 nm is arranged at pitches of 60 nm in the X direction and the Y direction. The pitches and intervals between respective adjacent opening portions are uniform in both the X direction and the Y direction. In a peripheral circuit area other than the memory cell array area, no opening portion is formed except for a part of the peripheral circuit area in which a positioning monitor mark is formed, and thus the surface of the silicon substrate 80 is covered with the hard mask, forming a dark pattern portion.

Subsequent steps are not shown in the drawings; however, after sequentially forming the metal plugs 84, the heater electrodes 85, the phase-change material layer 87, and the upper electrodes 88, similarly to a general semiconductor device, an interlayer insulating film, metal wiring or the like are formed to complete the PRAM shown in FIGS. 2A and 2B.

A method of manufacturing a semiconductor device according to the present invention, specifically, a method for processing a lower layer after forming a hard mask is explained in detail below.

As described above, a plurality of the space patterns (light pattern portions), which are formed using the sidewall spacers and have a predetermined width, are arranged at a predetermined pitch in a micro-processing area of the semiconductor device typified by the memory cell array area. On the other hand, a pattern of an arbitrary size and shape is formed in an area (non micro-processed area) other than the micro-processing area such as a peripheral circuit area; however, as given in the following example, a positioning monitor mark is formed in the non micro-processed area. In the non micro-processed area, the area in which the positioning monitor mark is formed is a light pattern portion and an area other than the area in which the positioning monitor mark is formed is a dark pattern portion. The light pattern portion is an area of the mask in which a mask material such as a space or an opening area is removed. The dark pattern portion is an area of the mask in which a mask material such as a line or island is formed.

FIGS. 6 to 14 are explanatory diagrams of a manufacturing process of a semiconductor device according to a first embodiment of the present invention. Among FIGS. 6 to 14, FIGS. 6A, 7A, 8A, 9A, 10A, 11A, 12A, 13A, and 14A are plan views and FIGS. 6B, 7B, 8B, 9B, 10B, 11B, 12B, 13B, and 14B are cross sectional views. A process of forming isolation trenches included in the manufacturing process of the PRAM exemplified above is explained below.

Figure 6A:
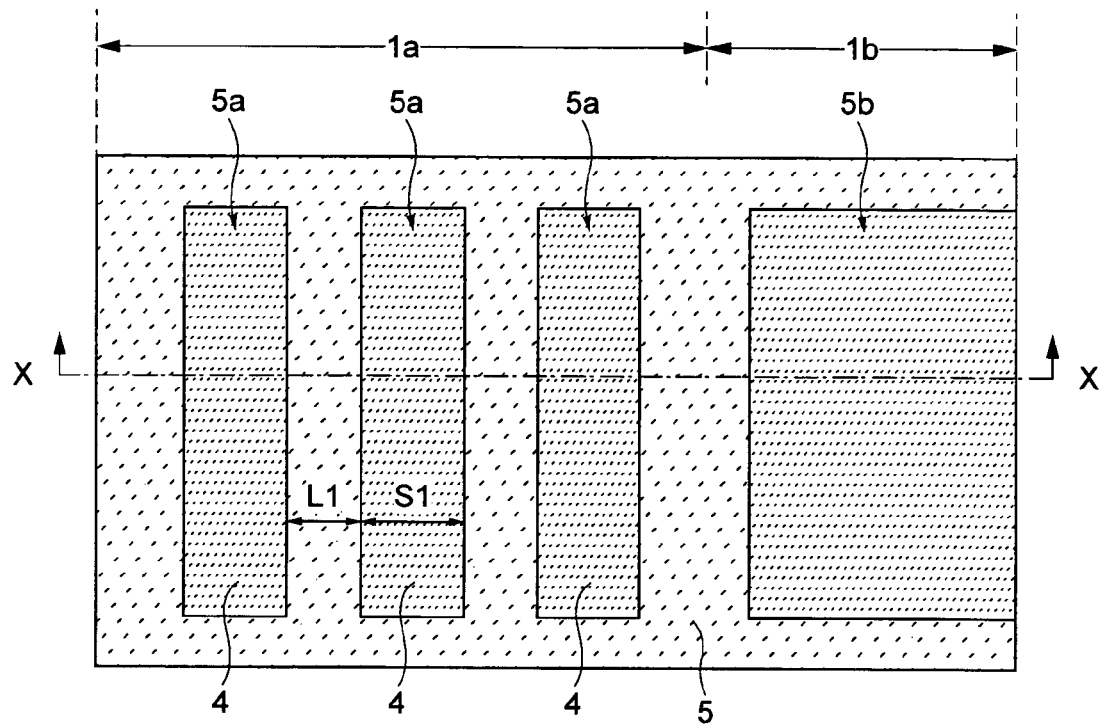
FIGS. 6A and 6B are explanatory diagram of a manufacturing process of a semiconductor device according to a first embodiment of the present invention, where
Figure 6B:
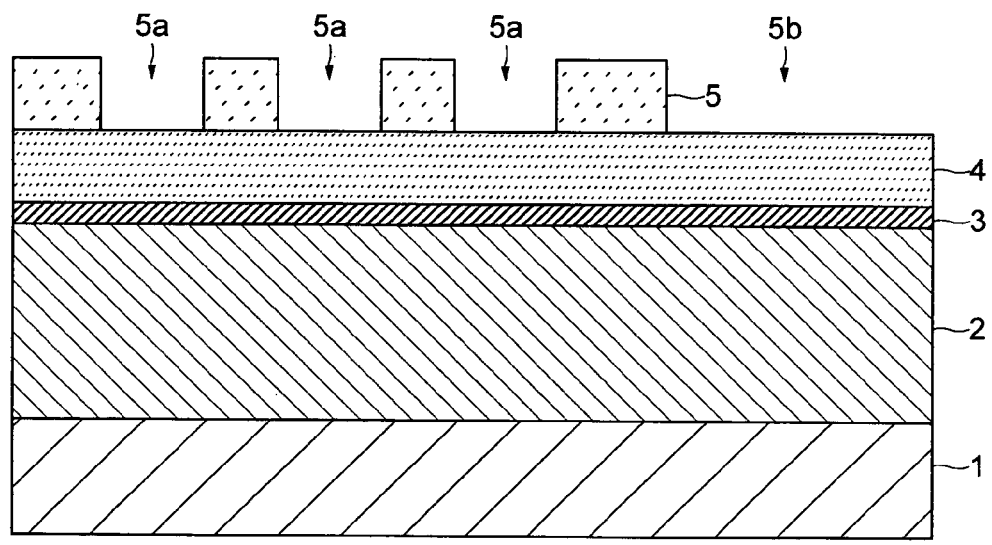

In the manufacturing process of a semiconductor device according to the first embodiment, as shown in FIGS. 6A and 6B, an amorphous carbon layer 2, a silicon nitride layer 3, and a polysilicon layer 4 are sequentially deposited on a silicon substrate 1 that is to be processed. The amorphous carbon layer 2 serves as a material of a hard mask when the silicon substrate 1 is etched. The silicon nitride layer 3 serves as a material of a hard mask to be used for forming a pattern in the amorphous carbon layer 2. The polysilicon layer 4 is a layer that serves as a core pattern when forming the sidewall spacers.

Thereafter, a resist pattern 5 is formed for patterning the polysilicon layer 4. After the photoresist layer is formed, the resist pattern 5 is formed by patterning the photoresist layer using a photolithography technique. The resist pattern 5 according to the first embodiment has a plurality of elongated openings 5a (three in the first embodiment) formed in a memory cell array area (first area) 1a and a large opening 5b formed in a peripheral circuit area (second area).

The openings 5a are used for forming the sidewall spacers that are required for forming a fine line and space pattern of a size smaller than the resolution limit of lithography. For example, an interval (line width) L1 between the openings 5a is set to 50 nm and a width (space width) S1 of the openings 5a is set to 70 nm. The opening 5b is provided to remove from a peripheral circuit area 1b the polysilicon layer 4 that serves as the core pattern (sidewall core) when forming the sidewall spacers.

A case where a single-layer resist is used is explained here; however, a multi-layer resist layer that is formed of three layers, that is, a BARC (Bottom Antireflective Coating) layer, a silicon-containing photoresist layer, and a conventional photoresist layer is preferable as a resist layer for forming a desirable fine pattern. Generally, the BARC layer serves to control a reflectance of a surface of an underlying layer. In addition, the BARC layer is commonly used to fill concave portions of the underlying layer to smoothen the surface thereof and is further used as a mask function reinforcing material when the underlying layer is etched. The thickness of the BARC layer is, for example, 200 nm. The silicon-containing photoresist layer is originally a layer for reinforcing an endurable level of a photoresist against etching when the photoresist is used as an etching mask. The silicon-containing photoresist layer has, for example, a silicon content of 40% and a thickness of 40 nm. The conventional photoresist layer is used for ArF, and is patterned using an ArF immersion exposure device.

Figure 7A:
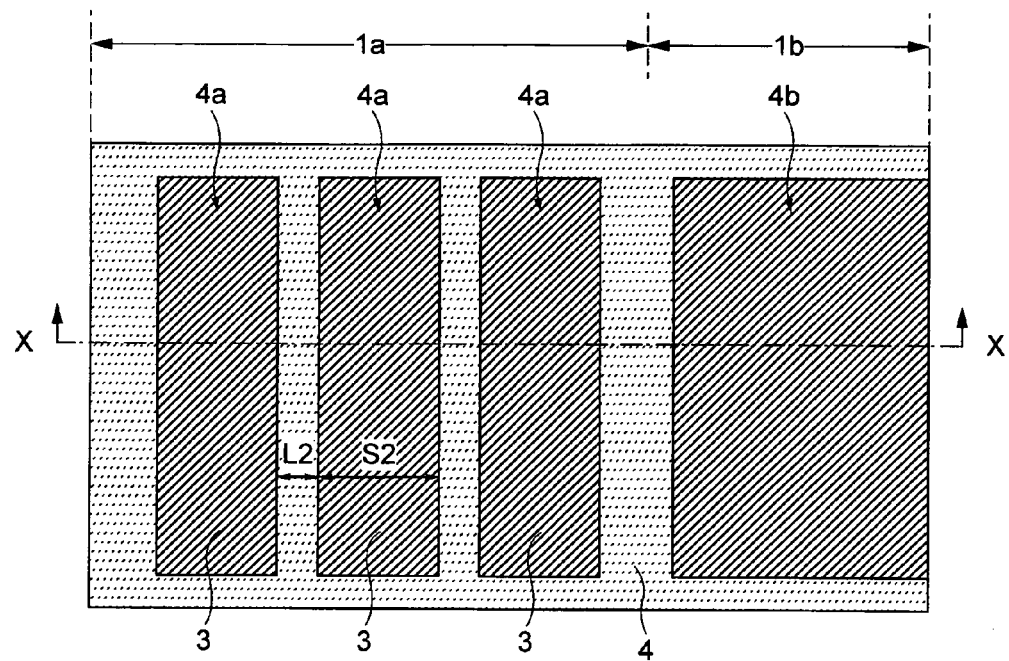
FIGS. 7A and 7B are explanatory diagram of a manufacturing process of a semiconductor device according to a first embodiment of the present invention, where
Figure 7B:
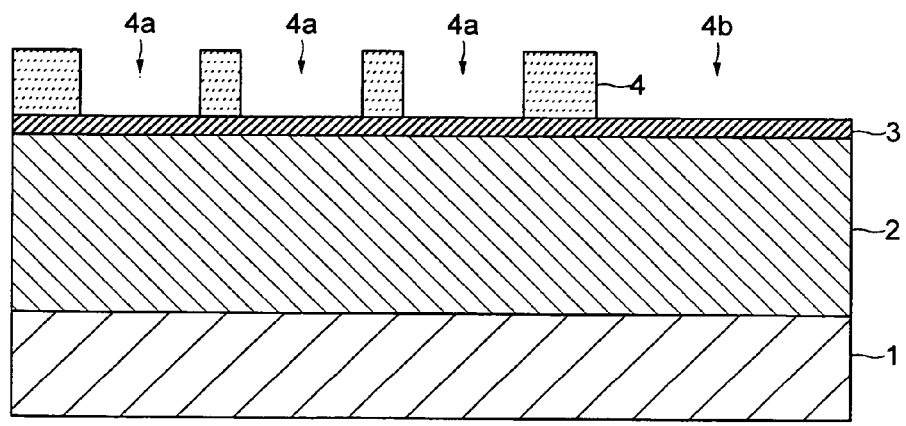

Next, as shown in FIGS. 7A and 7B, the resist pattern 5 is transferred onto the polysilicon layer 4 by dry etching the polysilicon layer 4 using the resist pattern 5 as a mask. Furthermore, a slimming process is also executed that causes sidewalls of openings 4a and 4b formed in the polysilicon layer 4 to recede uniformly. In this case, the sidewalls are caused to recede by 10 nm and a pattern having a line width L1 of 50 nm and a space width S1 of 70 nm is changed to a pattern having a line width L2 of 30 nm and a space width S2 of 90 nm. The ratio of the line width L2 and the space S2 is adjusted to be 1:3. This is because, sidewall spacers having a thickness of approximately 30 nm are formed in a subsequent step on the inner side surfaces of the opening 4b having a width of 90 nm and an interval between adjacent sidewall spacers is kept to approximately 30 nm.

Figure 8A:
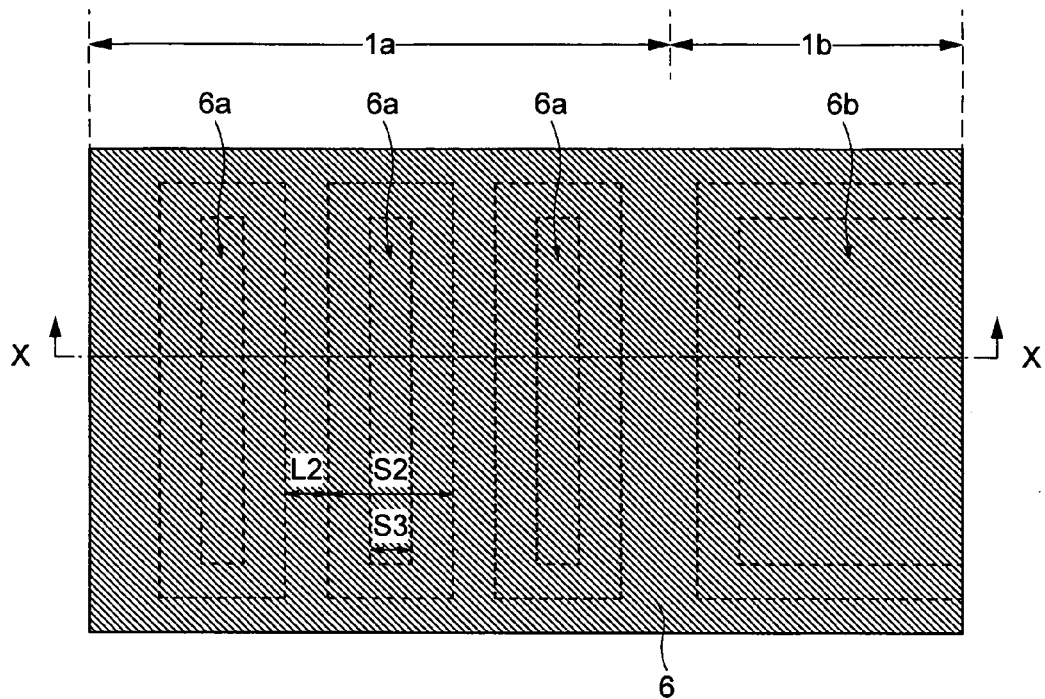
FIGS. 8A and 8B are explanatory diagram of a manufacturing process of a semiconductor device according to a first embodiment of the present invention, where
Figure 8B:
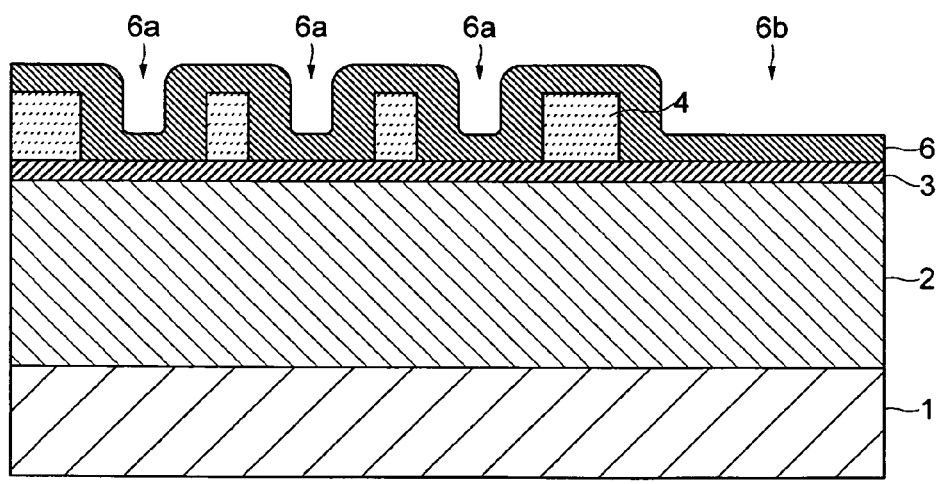

Next, as shown in FIGS. 8A and 8B, a conformal film, for example, a silicon oxide layer 6 is uniformly formed over the polysilicon layer 4 on which the openings 4a and 4b are provided. The silicon oxide layer 6 is used for forming a fine pattern of a size smaller than the resolution limit of lithography. The thickness of the silicon oxide layer 6 is set to 30 nm (=the line width L2 of the sidewall core) and concave portions 6a, respectively, having a width S3 of 30 nm are formed in the silicon oxide layer 6 that is formed on the openings 4a of the polysilicon layer 4.

When forming a pattern of a size smaller than the resolution limit of lithography, the sidewall spacers can be formed by etching back a uniform silicon oxide layer 6, the sidewall spacers thus formed can be used as masks to form a mask pattern of a size smaller than the resolution limit of lithography, and the mask pattern can be further used to pattern the underlying layer. However, in the first embodiment, the silicon oxide layer 6 is not etched back immediately, but etched back after embedding polysilicon as described later. Therefore, the silicon oxide layer 6 is not processed as an independent sidewall spacer. A portion that becomes the sidewall spacer when the silicon oxide layer 6 is etched back, that is, a portion that covers a side surface of a core pattern, is called "sidewall spacer".

Figure 9A:
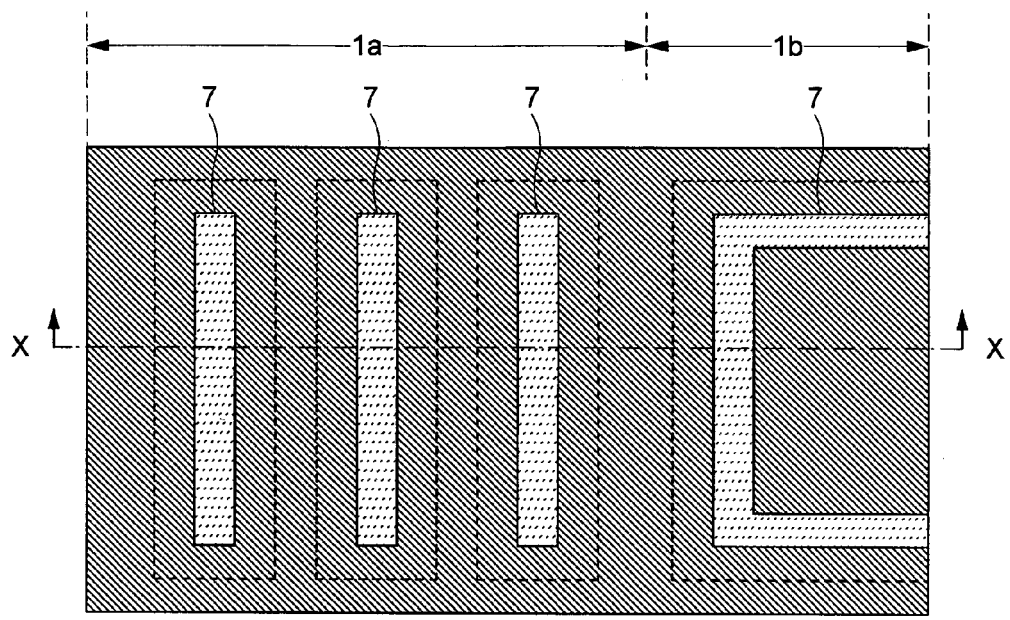
FIGS. 9A and 9B are explanatory diagram of a manufacturing process of a semiconductor device according to a first embodiment of the present invention, where
Figure 9B:
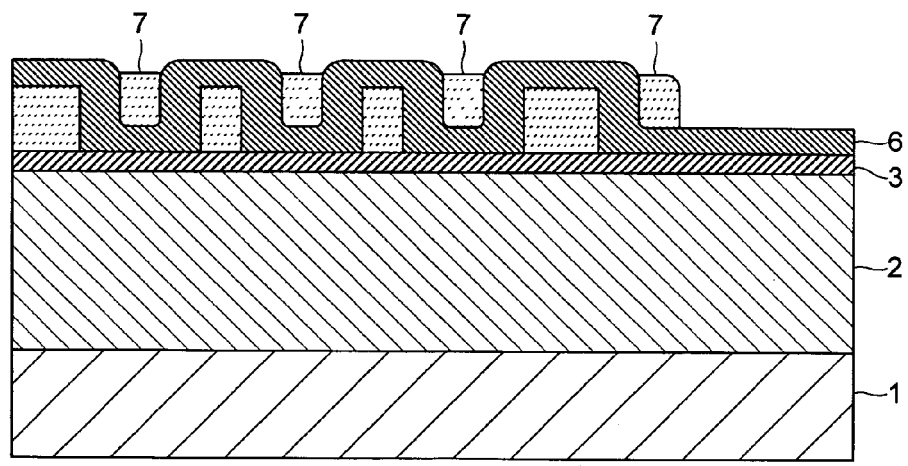

Next, as shown in FIGS. 9A and 9B, a polysilicon layer 7 is formed over the silicon oxide layer 6. The polysilicon layer 7 is etched back and embedded inside the concave portions 6a of the silicon oxide layer 6. In the first embodiment, the polysilicon layer 7 is embedded across the full width of the concave portion 6a in an X direction. In this case, a large portion of the polysilicon layer 7 inside the peripheral circuit area 1b can be removed; however, sidewall spacers of the polysilicon layer 7 remain along inner side surfaces of a concave portion 6b of the silicon oxide layer 6 that is provided in the peripheral circuit area 1b.

Figure 10A:
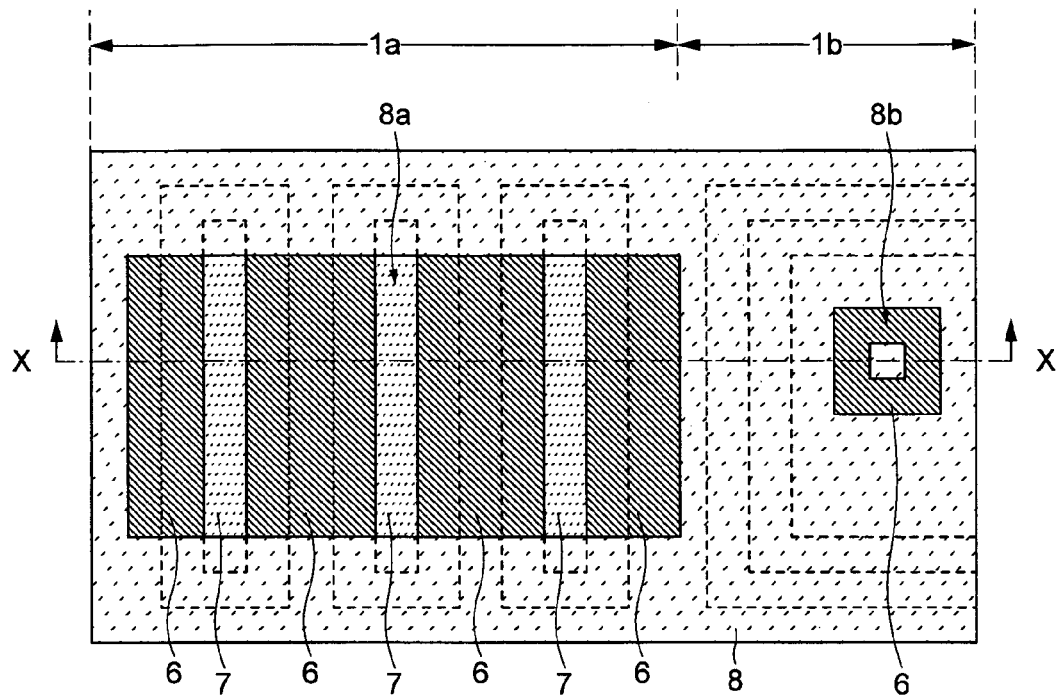
FIGS. 10A and 10B are explanatory diagram of a manufacturing process of a semiconductor device according to a first embodiment of the present invention, where
Figure 10B:
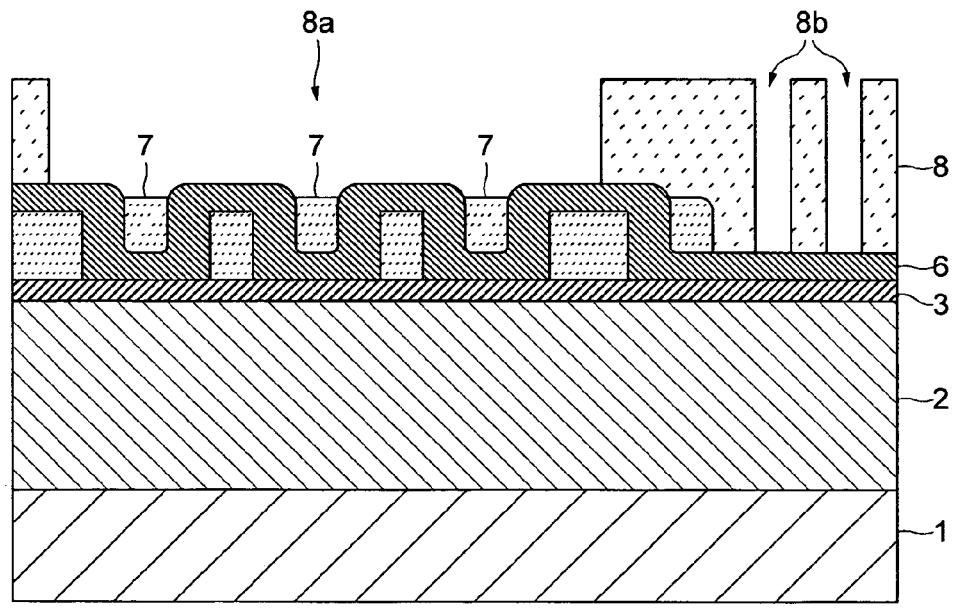

Next, as shown in FIGS. 10A and 10B, a resist pattern (mask layer) 8 is formed using the photolithography technique. The resist pattern 8 covers both edges (looped-back portions) of the sidewall spacers having a loop-shape as well as the sidewall spacers of the polysilicon layer 7 provided in the peripheral circuit area 1b. The resist pattern 8 includes an opening 8a provided inside the memory cell array area 1a and openings 8b provided inside the peripheral circuit area 1b. The openings 8b are patterns used for forming a positioning monitor mark in the peripheral circuit area 1b. The opening 8a defines a processing area inside the memory cell array area 1a. Thus, a portion covered by the resist pattern 8 in the memory cell array area 1a is a non-processed area. Because the openings 8a and 8b of the resist pattern 8 are formed using the photolithography technique, a processing accuracy thereof is restricted according to a resolution limit. That is, sizes of the openings 8a and 8b are greater than or equal to the resolution limit. Note that scales of the memory cell array area 1a and the peripheral circuit area 1b are not the same in the drawings.

Figure 11A:
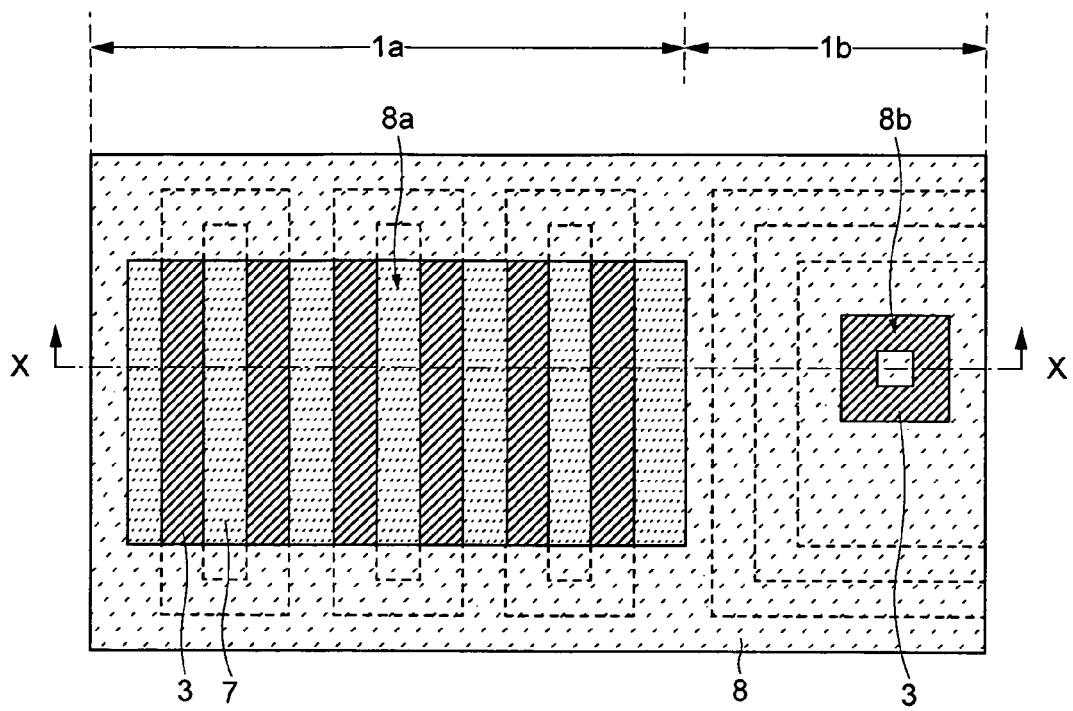
FIGS. 11A and 11B are explanatory diagram of manufacturing process of a semiconductor device according to a first embodiment of the present invention, where
Figure 11B:
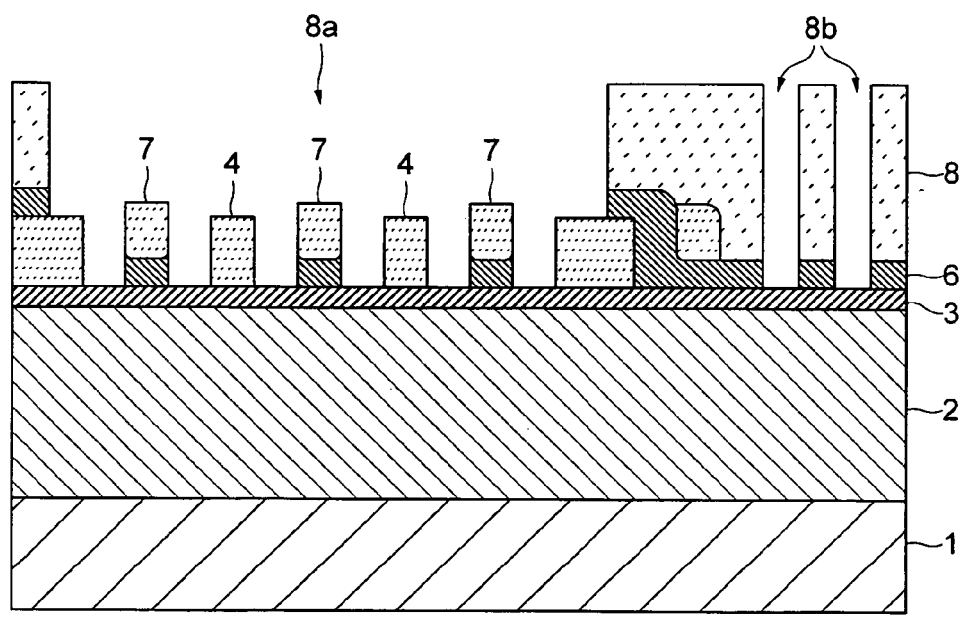

Next, as shown in FIGS. 11A and 11B, the exposed sidewall spacers of the silicon oxide layer 6 are removed from the opening 8a and the exposed silicon oxide layer 6 is removed from the openings 8b used for forming a positioning monitor mark by anisotropic dry etching, thus exposing the underlying silicon nitride layer 3. Because the polysilicon layer 7 is embedded inside the concave portions 6a of the silicon oxide layer 6, only the sidewall spacers and a portion whose upper surface is exposed are removed without removing the silicon oxide layer 6 that is immediately beneath the polysilicon layer 7. According to this patterning method, width accuracy can be increased as compared to a case where the sidewall spacers are formed by etching back the silicon oxide layer 6. Because the sidewall spacers of the silicon oxide layer 6 formed inside the peripheral circuit area 1b are covered by the resist pattern 8, it is possible to prevent peeling off of a polysilicon chip and adhering of the polysilicon chip to another wafer while etching the silicon oxide layer 6.

Figure 12A:
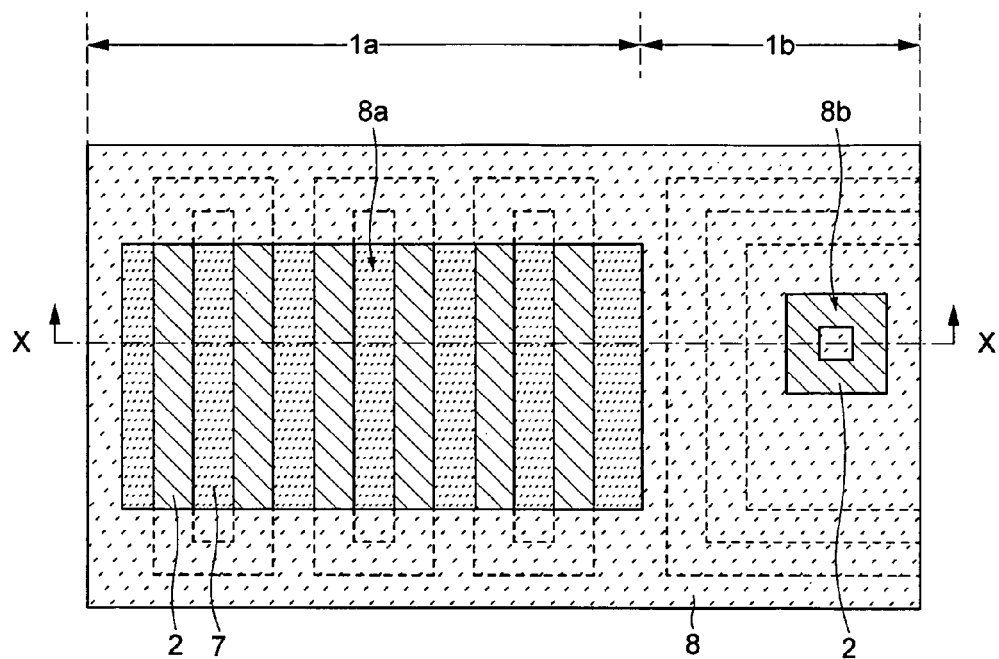
FIGS. 12A and 12B are explanatory diagram of a manufacturing process of a semiconductor device according to a first embodiment of the present invention, where
Figure 12B:
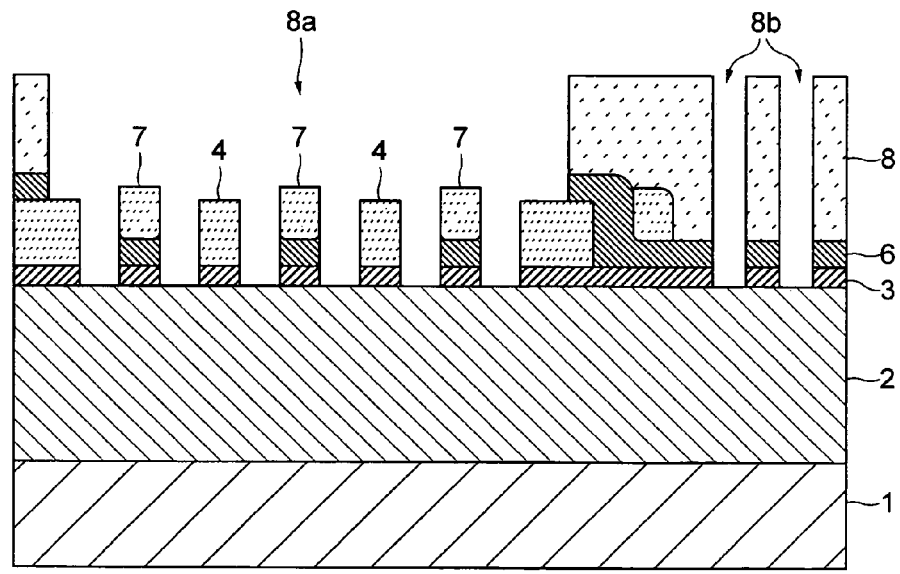

Next, as shown in FIGS. 12A and 12B, the exposed silicon nitride layer 3 is removed by etching. Accordingly, a line and space pattern processed to a size smaller than the resolution limit of photolithography using the sidewall spacers and a pattern of an arbitrary size exemplified with the positioning monitor mark are combined on the silicon nitride layer 3 and a common hard mask is completed in the memory cell array area 1a and the peripheral circuit area 1b.

Figure 13A:
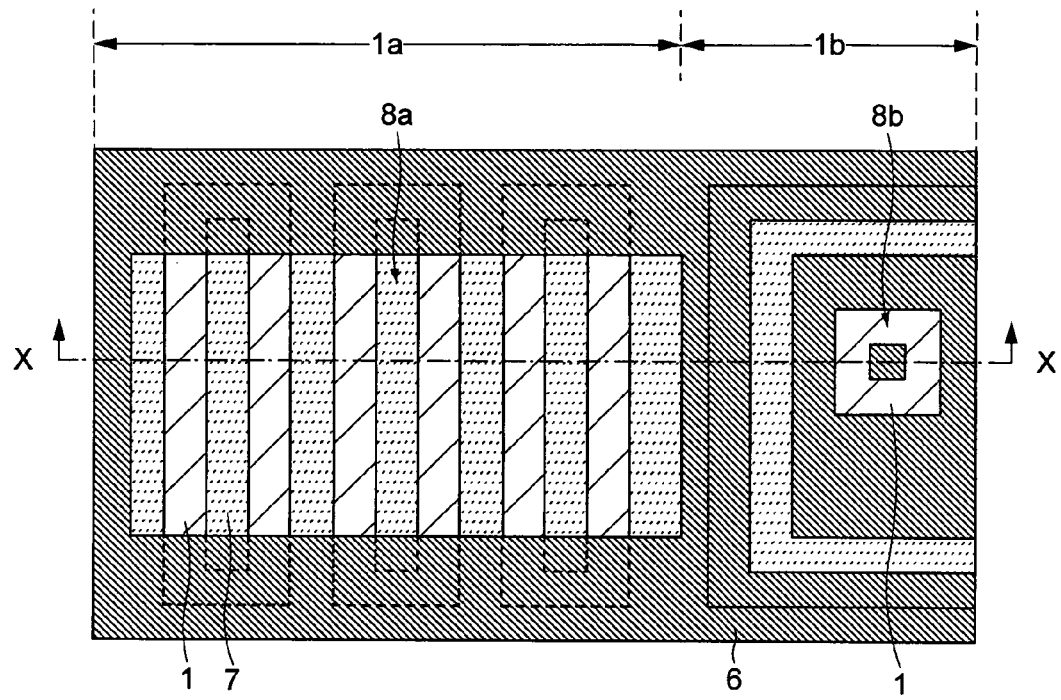
FIGS. 13A and 13B are explanatory diagram of a manufacturing process of a semiconductor device according to a first embodiment of the present invention, where
Figure 13B:
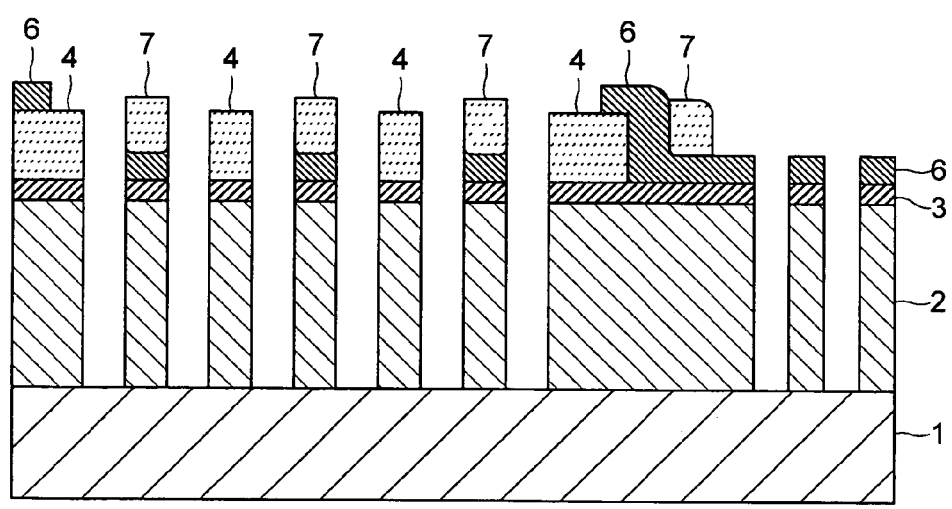

Next, as shown in FIGS. 13A and 13B, the amorphous carbon layer 2 is etched using the silicon nitride layer 3 as a mask.

Figure 14A:
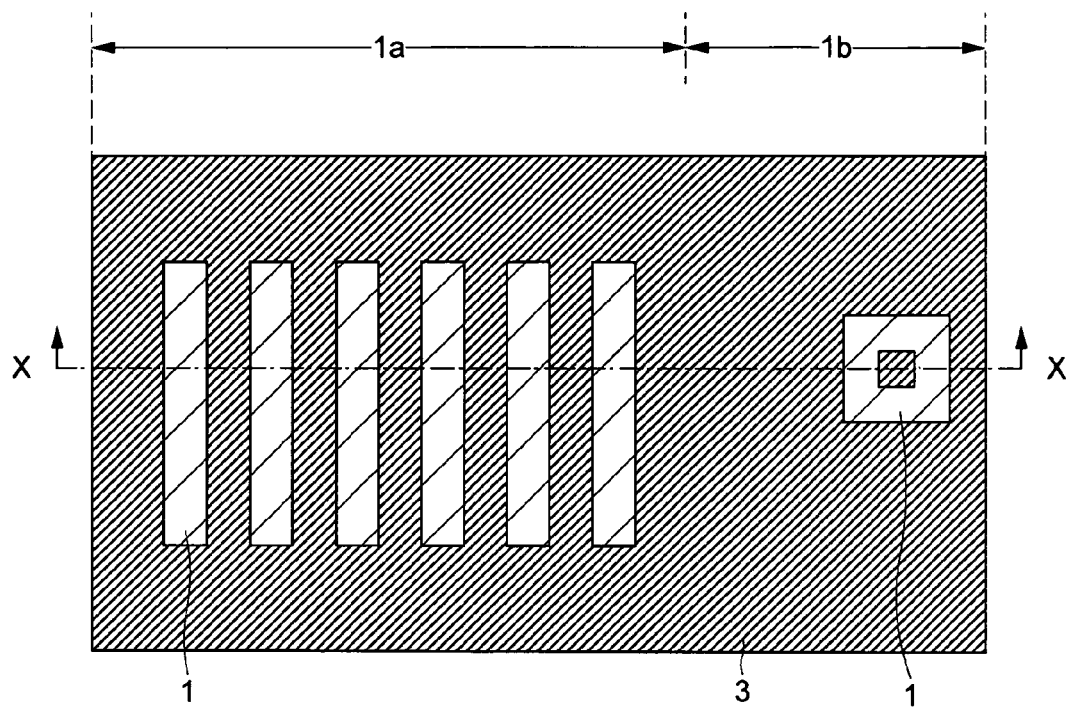
FIGS. 14A and 14B are explanatory diagram of a manufacturing process of a semiconductor device according to a first embodiment of the present invention, where
Figure 14B:
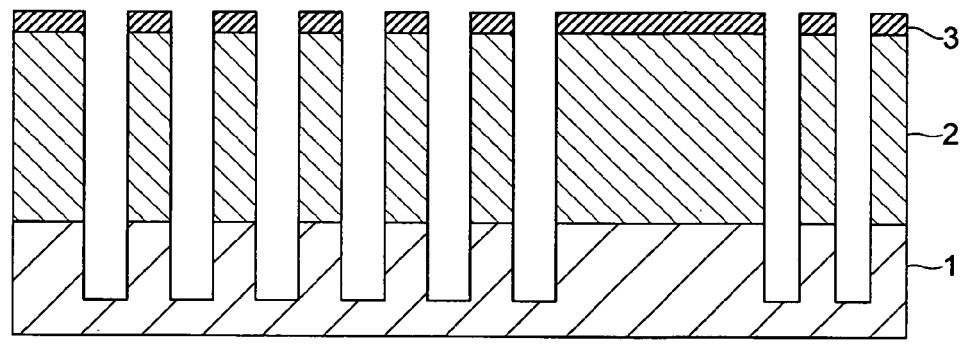

Next, as shown in FIGS. 14A and 14B, the silicon substrate 1 is etched using the amorphous carbon layer 2 as a mask. Thus, the silicon substrate 1 having the isolation trenches can be completed.

As described above, in the first embodiment, the sidewall core constituted by the polysilicon layer (first layer) 4 is formed over the silicon nitride layer 3 that is to be etched, and the sidewall spacers constituted by the silicon oxide layer (second layer) 6 are formed. Thereafter, once again, the polysilicon layer (third layer) 7 is formed and etched back and the polysilicon layer 7 is left inside the concave portions 6a formed on the surface of the silicon oxide layer 6. Furthermore, the silicon oxide layer 6 is etched using the polysilicon layer 7 and the sidewall core as the masks and a pattern of a size smaller than the resolution limit of photolithography can be obtained.

By providing the opening 4b in advance in the polysilicon layer 4 of the peripheral circuit area 1b when forming the sidewall core, the polysilicon layer 7 can be removed from the peripheral circuit area 1b while performing an etching back process in which the polysilicon layer 7 is left inside the concave portions 6a of the silicon oxide layer 6. Thus, a pattern of a size smaller than the resolution limit of photolithography and a pattern of an arbitrary size and shape can be determined simultaneously by etching the silicon oxide layer 6; therefore, both the patterns can be combined easily and cutting of the loop-shape portion can be performed very easily.

Because the surface of the silicon oxide layer 6 is smoothed by performing an etching back process after the polysilicon is embedded in the concave portions 6a of the silicon oxide layer 6, the pattern of an arbitrary size and shape can be sufficiently formed using the single-layer photoresist. According to the first embodiment, the silicon oxide layer 6 used for forming the independent sidewall spacers does not necessarily need to be etched back; however, polysilicon can be embedded after the silicon oxide layer 6 is etched back. Because any etching-back stopper layer is not required when the etching back process is not performed, the number of layers can be reduced and because any particular technique is not required for dry etching, a margin for variations in production conditions can be easily secured. Furthermore, not performing an etching back process is remarkably advantageous for controlling a pattern shape and reproducibility of a pattern size.

A manufacturing process in a second embodiment of the present invention is explained below in detail.

In the second embodiment, a mask pattern (second pattern) that includes openings for loop cut and a positioning monitor mark is already transferred onto a hard mask (silicon nitride layer). A silicon oxide layer is used as the hard mask for forming an amorphous carbon pattern.

FIGS. 15 to 22 are explanatory diagrams of the manufacturing process of a semiconductor device according to the second embodiment. Among FIGS. 15 to 22, FIGS. 15A, 16A, 17A, 18A, 19A, 20A, 21A, and 22A are plan views and FIGS. 15B, 16B, 17B, 18B, 19B, 20B, 21B, and 22B are cross sectional views. Constituent elements identical to those of the first embodiment are denoted by like reference characters and detailed explanations thereof will be omitted.

Figure 15A:
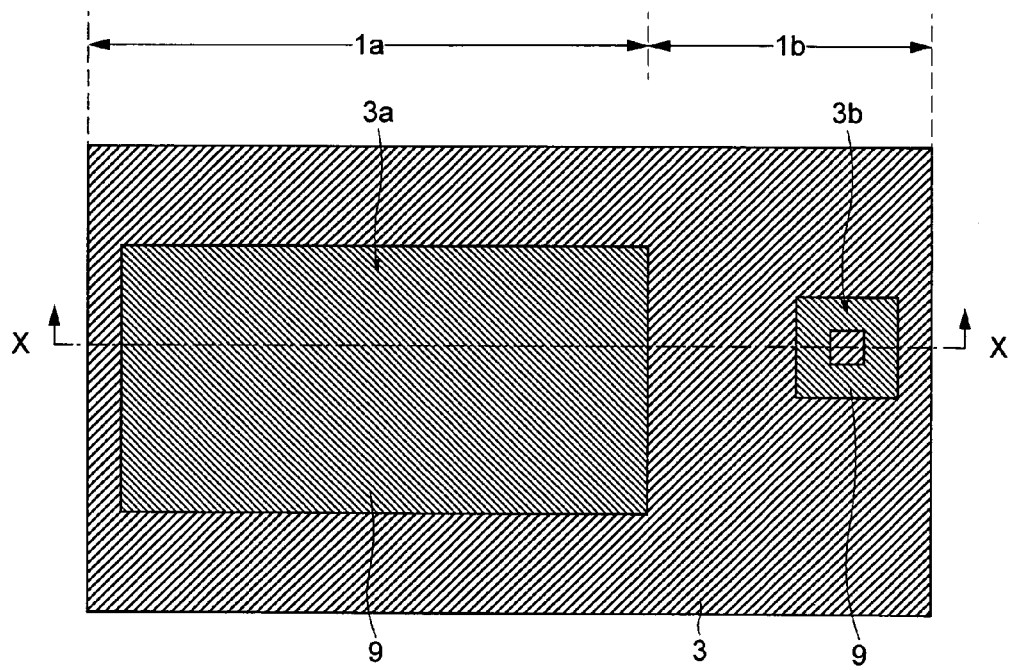
FIGS. 15A and 15B are explanatory diagram of a manufacturing process of a semiconductor device according to a second embodiment of the present invention, where
Figure 15B:
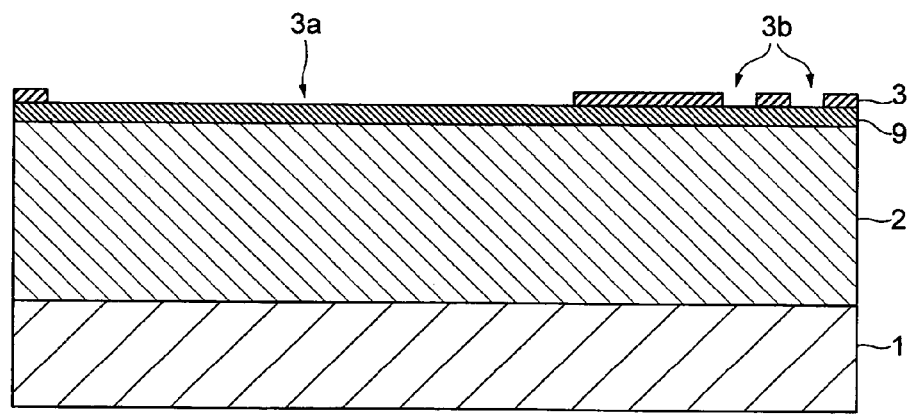

In the manufacturing process of a semiconductor device according to the second embodiment, first, as shown in FIGS. 15A and 15B, the amorphous carbon layer 2, a silicon oxide layer 9, and the silicon nitride layer 3 are sequentially deposited on the silicon substrate 1 that is to be processed. The silicon oxide layer 9 serves as a material of a hard mask used for patterning the amorphous carbon layer 2. Thereafter, openings 3a and 3b are formed in the silicon nitride layer 3 by patterning the silicon nitride layer 3. The silicon nitride layer 3 having a pattern formed thereon forms a mask layer and covers both ends of loop-shaped sidewall spacers and a portion other than a positioning monitor mark to be formed in the peripheral circuit area 1b.

Figure 16A:
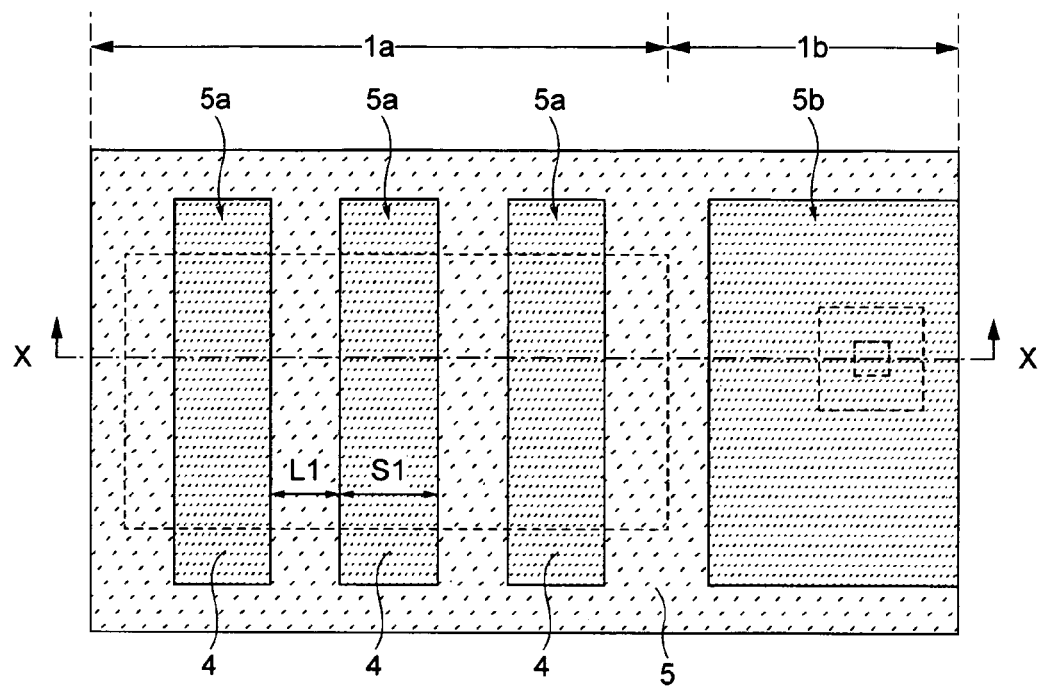
FIGS. 16A and 16B are explanatory diagram of a manufacturing process of a semiconductor device according to the second embodiment of the present invention, where
Figure 16B:
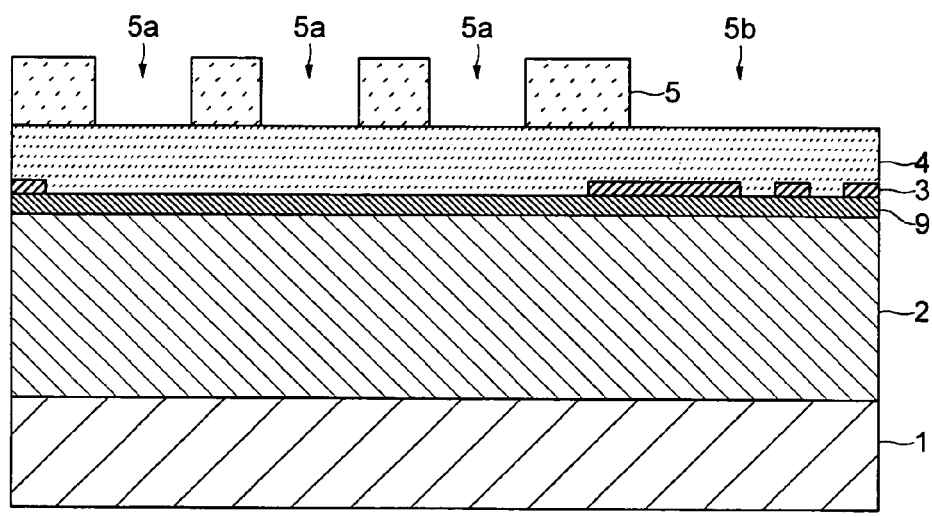

Next, as shown in FIGS. 16A and 16B, the polysilicon layer 4 is deposited on the silicon nitride layer 3. The polysilicon layer 4 is a layer that serves as a core pattern when forming the sidewall spacers.

Thereafter, the resist pattern 5 is formed for patterning the polysilicon layer 4. After the photoresist layer is formed, the resist pattern 5 is formed by patterning the photoresist layer using the photolithography technique. The resist pattern 5 according to the second embodiment includes a plurality of the elongated openings 5a (three in the second embodiment) formed in the memory cell array area 1a and the large opening 5b formed in the peripheral circuit area 1b.

The openings 5a form the sidewall spacers required for forming a fine line and space pattern of a size smaller than the resolution limit of lithography. It is preferable that the interval (line width) L1 between the openings 5a be 50 nm and the width (space width) S1 of the openings 5a be 70 nm. The opening 5b is provided for removing the polysilicon layer 4 that serves as the core pattern (sidewall core) when forming the sidewall spacers, from the peripheral circuit area 1b.

Figure 17A:
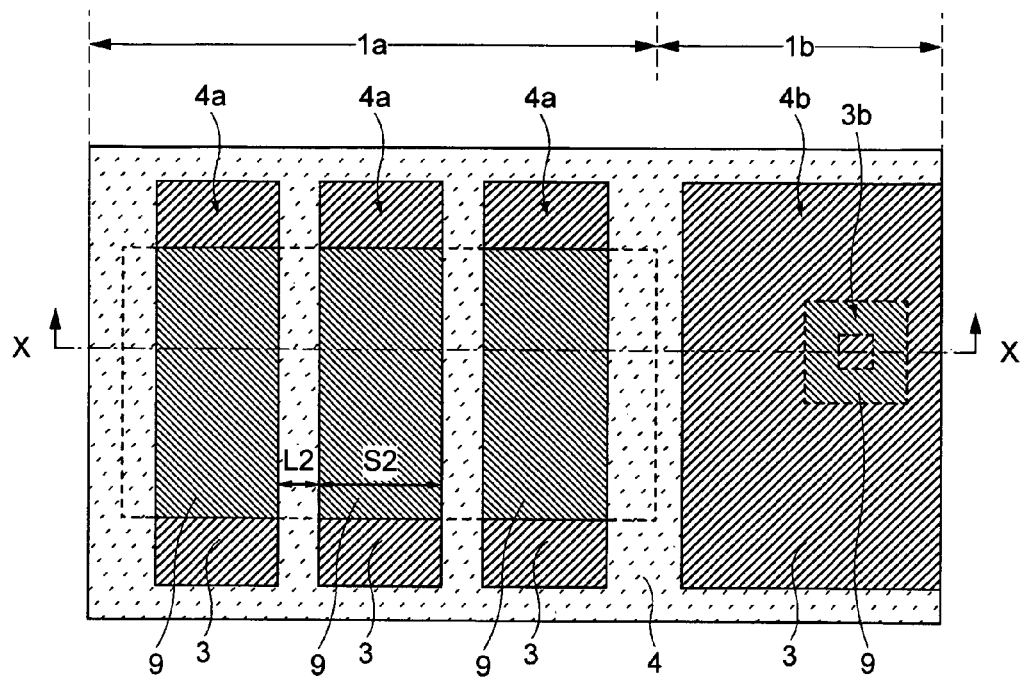
FIGS. 17A and 17B are explanatory diagram of a manufacturing process of a semiconductor device according to the second embodiment of the present invention, where
Figure 17B:
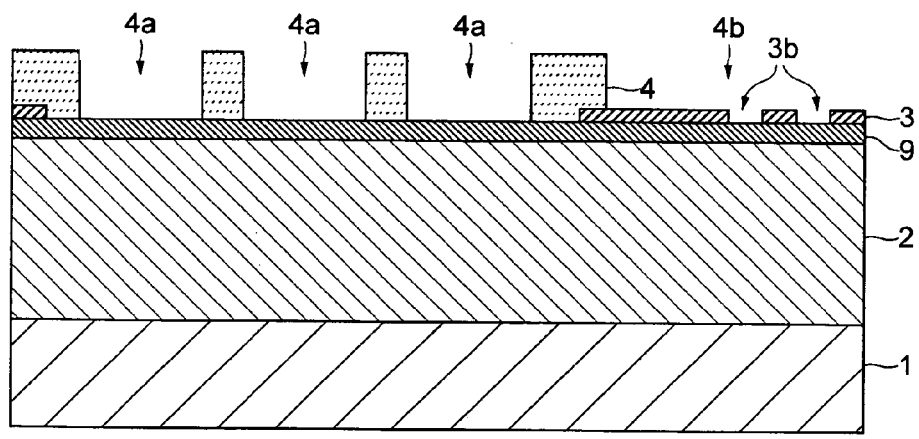

As shown in FIGS. 17A and 17B, the resist pattern 5 is transferred onto the polysilicon layer 4 by dry etching the polysilicon layer 4 using the resist pattern 5 as a mask. Furthermore, a slimming process is also executed that causes the sidewalls of the openings 4a and 4b formed in the polysilicon layer 4 to recede uniformly. In this case, the sidewalls are caused to recede by 10 nm and a pattern having the line width L1 of 50 nm and the space width S1 of 70 nm is changed to a pattern having the line width L2 of 30 nm and the space width S2 of 90 nm.

Figure 18A:
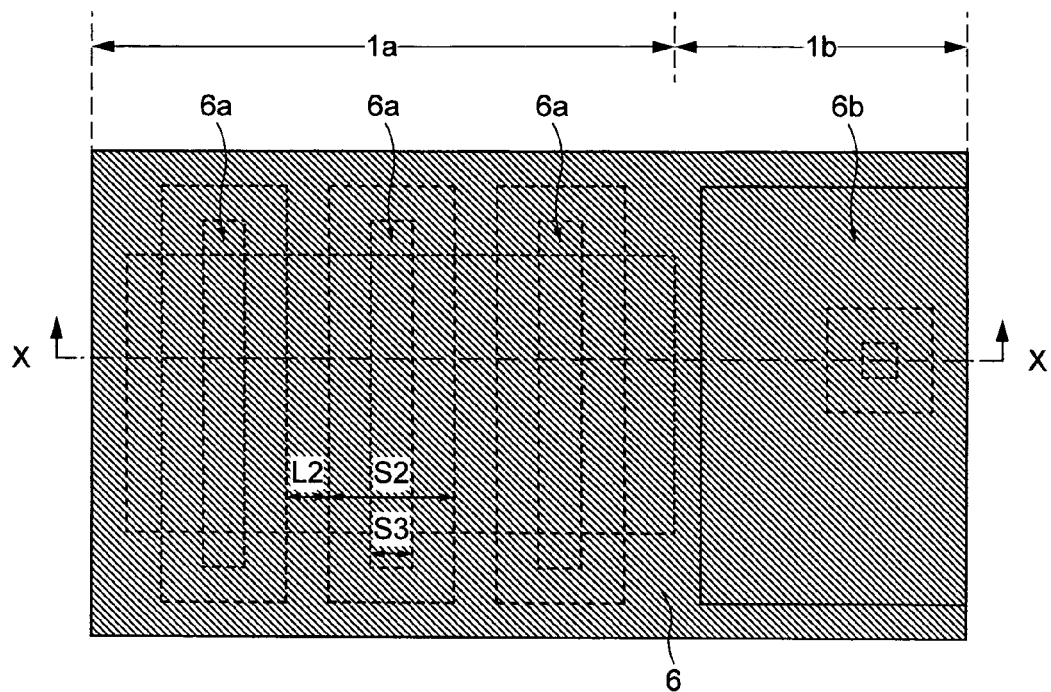
FIGS. 18A and 18B are explanatory diagram of a manufacturing process of a semiconductor device according to the second embodiment of the present invention, where
Figure 18B:
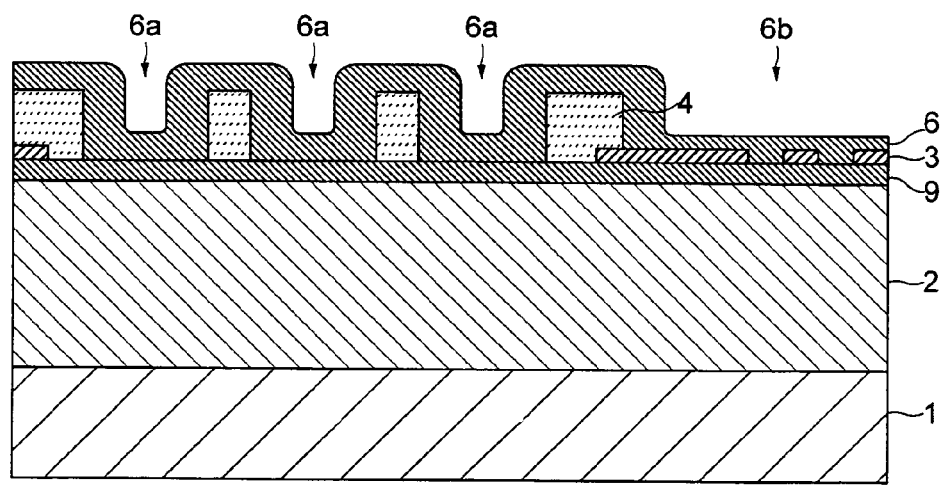

Next, as shown in FIGS. 18A and 18B, the silicon oxide layer 6 is uniformly formed over the polysilicon layer 4 on which the openings 4a and 4b are provided. The thickness of the silicon oxide layer 6 is set to 30 nm and the concave portions 6a, respectively, having the width S3 of 30 nm are formed in the silicon oxide layer 6 that is formed on the openings 4a of the polysilicon layer 4.

Figure 19A:
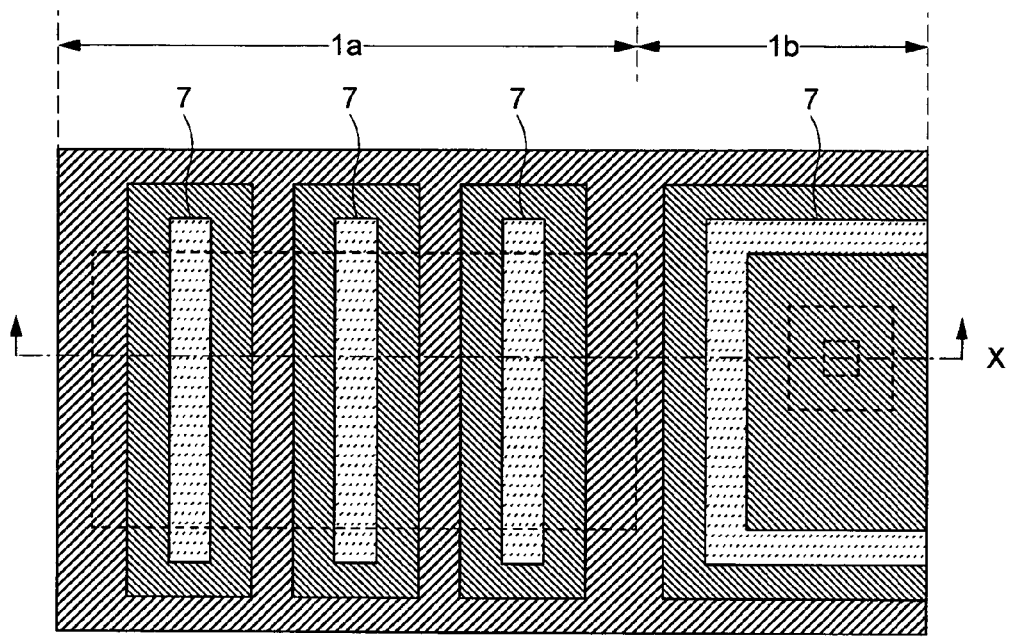
FIGS. 19A and 19B are explanatory diagram of a manufacturing process of a semiconductor device according to the second embodiment of the present invention, where
Figure 19B:
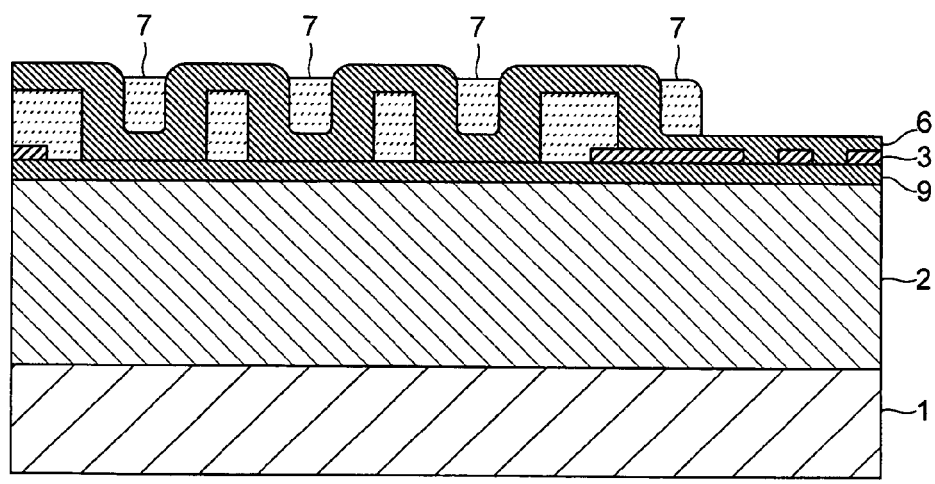

Next, as shown in FIGS. 19A and 19B, the polysilicon layer 7 is formed over the silicon oxide layer 6. The polysilicon layer 7 is etched back and it is embedded inside the concave portions 6a of the silicon oxide layer 6. In this case, a large portion of the polysilicon layer 7 inside the peripheral circuit area 1b can be removed; however, the sidewall spacers of the polysilicon layer 7 remain along inner side surfaces of the concave portion 6b of the silicon oxide layer 6 arranged in the peripheral circuit area 1b.

Figure 20A:
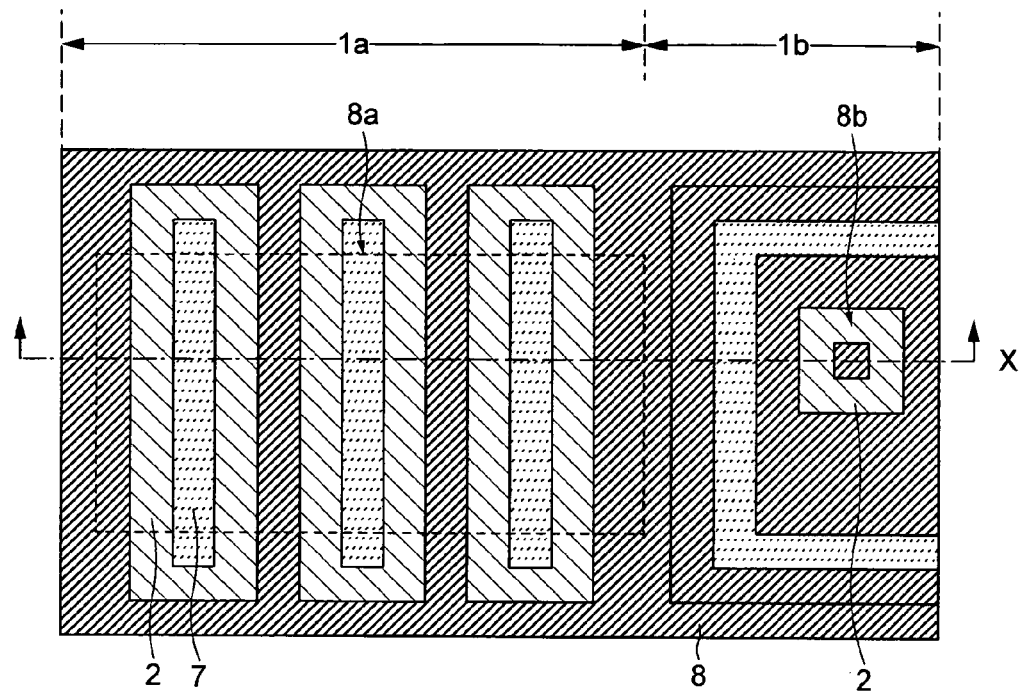
FIGS. 20A and 20B are explanatory diagram of a manufacturing process of a semiconductor device according to the second embodiment of the present invention, where
Figure 20B:
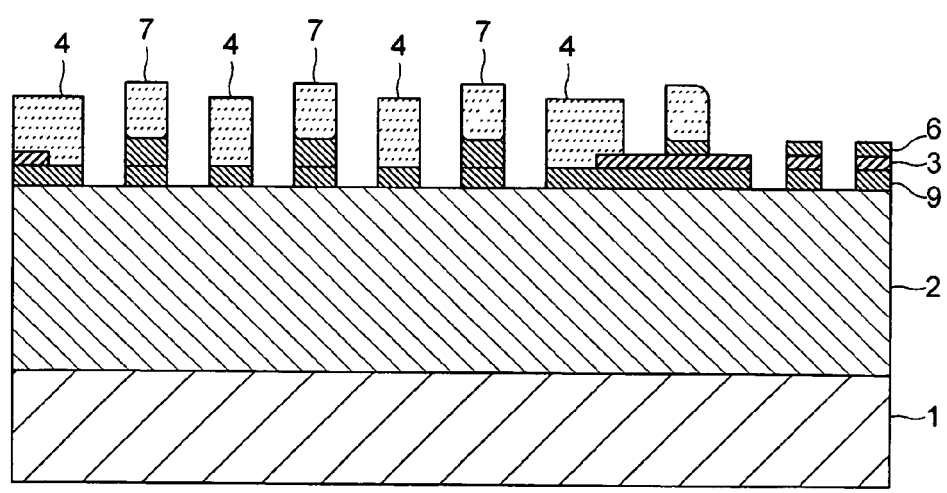

Next, as shown in FIGS. 20A and 20B, the underlying silicon oxide layer 9 is removed by removing the exposed sidewall spacers of the silicon oxide layer 6 from the opening 8a and the exposed silicon oxide layer 6 from the openings 8b used for forming a positioning monitor mark by anisotropic dry etching. However, when the underlying silicon oxide layer 9 is covered by the silicon nitride layer 3, the silicon nitride layer 3 is only exposed without removing a relevant portion. That is, the underlying silicon oxide layer 9 is removed only in the openings 3a and 3b. Thus, the line and space pattern processed to a size smaller than the resolution limit of photolithography using the sidewall spacers, and a pattern of an arbitrary size exemplified with the positioning monitor mark are combined on the silicon oxide layer 9 and a common hard mask is completed in the memory cell array area 1a and the peripheral circuit area 1b.

Because the polysilicon layer 7 is embedded inside the concave portions 6a of the silicon oxide layer 6, only the sidewall spacers and a portion whose upper surface is exposed are removed without removing the silicon oxide layer 6 immediately beneath the polysilicon layer 7. According to this patterning method, width accuracy can be increased as compared to a case where the sidewall spacers are formed by etching back the silicon oxide layer 6.

Figure 21A:
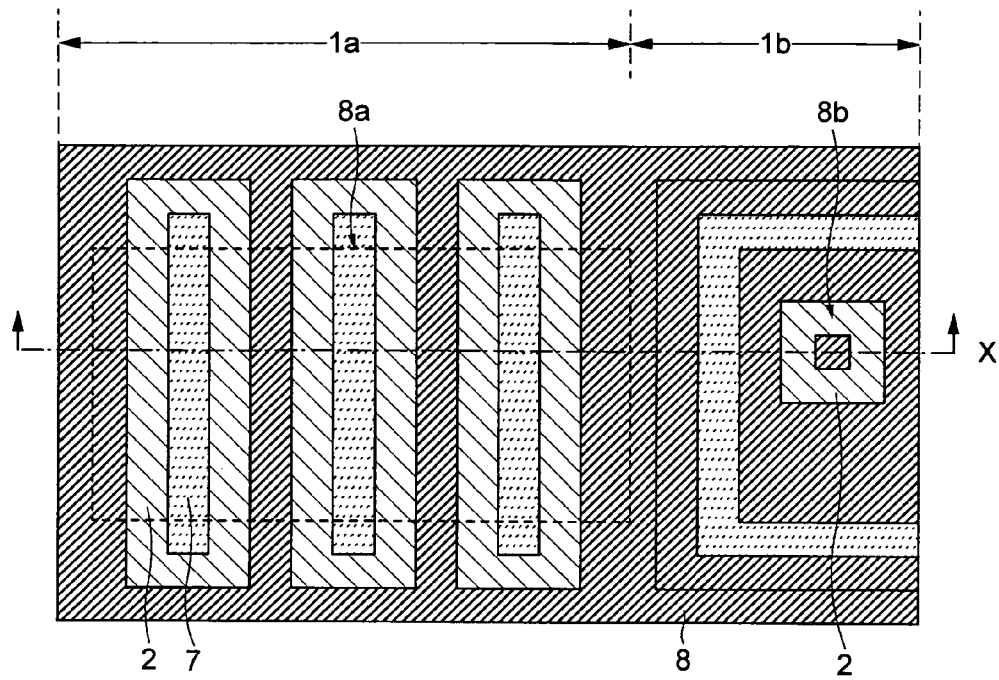
FIGS. 21A and 21B are explanatory diagram of a manufacturing process of a semiconductor device according to the second embodiment of the present invention, where
Figure 21B:
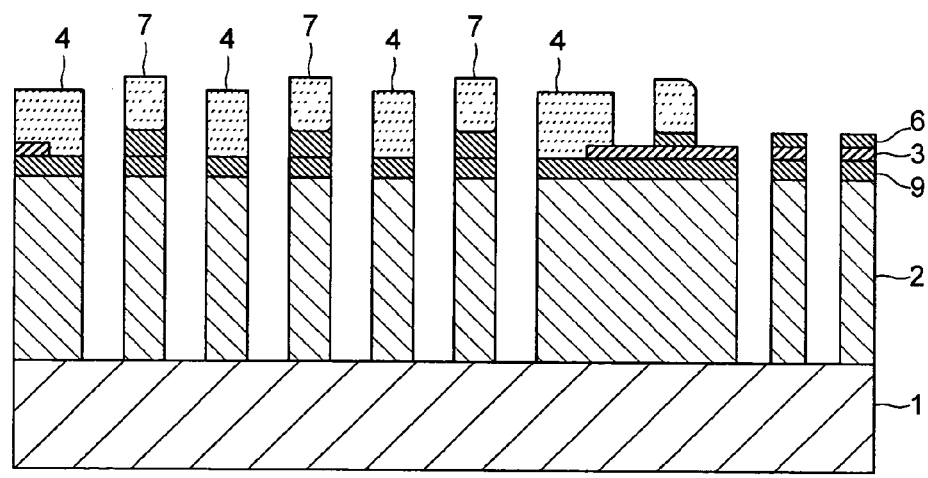

Next, as shown in FIGS. 21A and 21B, the amorphous carbon layer 2 is etched using the silicon oxide layer 9 as a mask.

Figure 22A:
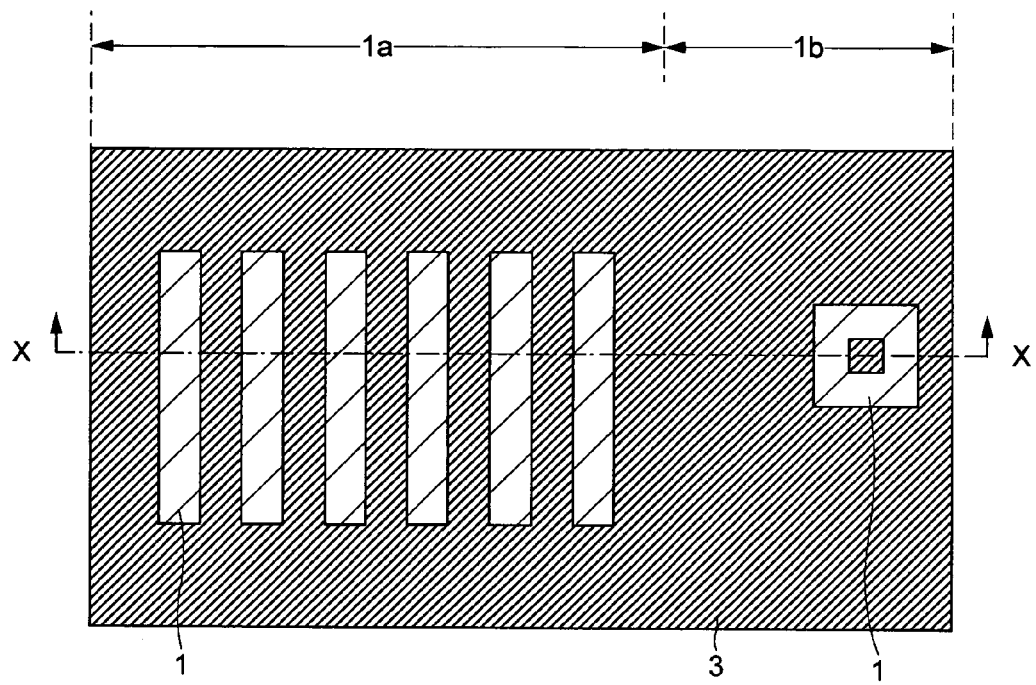
FIGS. 22A and 22B are explanatory diagram of a manufacturing process of a semiconductor device according to the second embodiment of the present invention, where
Figure 22B:
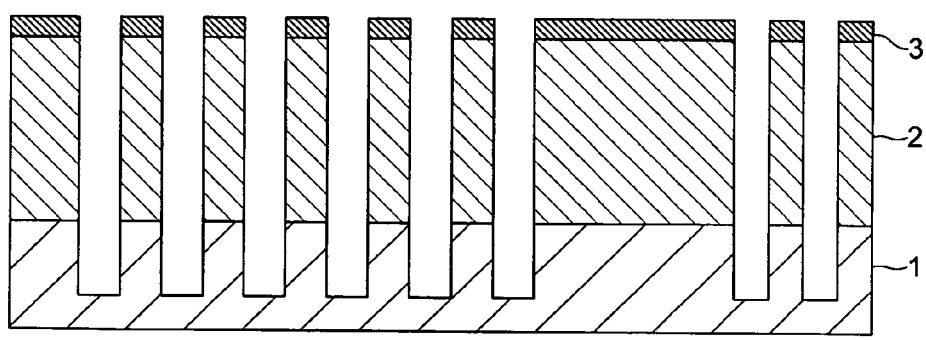

Next, as shown in FIGS. 22A and 22B, the silicon substrate 1 is etched using the amorphous carbon layer 2 as a mask. Thus, the silicon substrate 1 having the isolation trenches can be completed.

As described above, in the second embodiment, the sidewall core constituted by the polysilicon layer 4 is formed over the silicon oxide layer 9 that is to be etched and the sidewall spacers constituted by the silicon oxide layer 6 are formed. Thereafter, once again, the polysilicon layer 7 is formed and etched back and the polysilicon layer 7 is left inside the concave portions 6a formed on the surface of the silicon oxide layer 6. Furthermore, the silicon oxide layer 6 is etched using the polysilicon layer 7 and the sidewall core as the masks and a pattern of a size smaller than the resolution limit of photolithography can be obtained.

By providing the opening 4b in advance in the polysilicon layer 4 of the peripheral circuit area 1b when forming the sidewall core, the polysilicon layer 7 can be removed from the peripheral circuit area 1b while performing the etching back process in which the polysilicon layer 7 is left in the concave portions 6a of the silicon oxide layer 6. Furthermore, by patterning the silicon nitride layer 3 provided between the silicon oxide layer 9 and the polysilicon layer 4 in advance, a pattern of a size smaller than the resolution limit of photolithography and a pattern of an arbitrary size and shape can be determined simultaneously. As a result, both the patterns can be combined easily and cutting of a loop-shaped portion can be performed very easily. Furthermore, after forming the resist pattern 5 by patterning the silicon nitride layer 3 in advance, because any resist application process is not performed during micro-processing such as processing of the sidewall spacers, the manufacturing process can be simplified and a manufacturing yield can be increased.

Furthermore, the silicon oxide layer 9 that is formed of a material same as that of the sidewall spacers can be used as the hard mask layer for patterning the amorphous carbon layer 2 by patterning the silicon nitride layer 3 in advance and forming the polysilicon layer 7 without etching back the silicon oxide layer 6. Moreover, because any resist application process is not performed during the micro-processing such as processing of the sidewall spacers after the resist pattern 5 is formed, patterning can be performed up to the hard mask layer 9 at once by dry etching the silicon oxide layer 6, and as a result, the manufacturing process can be simplified and the manufacturing yield can be increased. Furthermore, because the silicon oxide layer 6 used for forming an independent sidewall spacers is not etched back, the etching-back stopper layer is not required and the number of layers can be reduced, thus enabling loop cut of the memory cell array area 1a that uses the silicon nitride layer 3 and formation of a pattern of an arbitrary size within the peripheral circuit area 1b. Because any particular technique is not required for dry etching, a margin for variations in production conditions can be easily secured. Furthermore, not performing the etching back process is remarkably advantageous for controlling the pattern shape and reproducibility of the pattern size.

Because the silicon nitride layer 3, which is provided between the silicon oxide layer 9 and the polysilicon layer 4, is patterned in advance before performing the micro-processing, and it is a photolithography process on a smooth silicon oxide layer 9, a pattern of an arbitrary size and shape can be sufficiently formed using the single-layer photoresist.

A manufacturing process in a third embodiment of the present invention is explained below in detail.

In the third embodiment, a line and space pattern is also formed in the spaces between the sidewall spacers.

FIGS. 23 to 31 are explanatory diagrams of a manufacturing process of a semiconductor device according to the third embodiment. Among FIGS. 23 to 31, FIGS. 23A, 24A, 25A, 26A, 27A, 28A, 29A, 30A, and 31A are plan views and FIGS. 23B, 24B, 25B, 26B, 27B, 28B, 29B, 30B, and 31B are cross sectional views. Constituent elements identical to those of the first embodiment are denoted by like reference characters and detailed explanations thereof will be omitted.

Figure 23A:
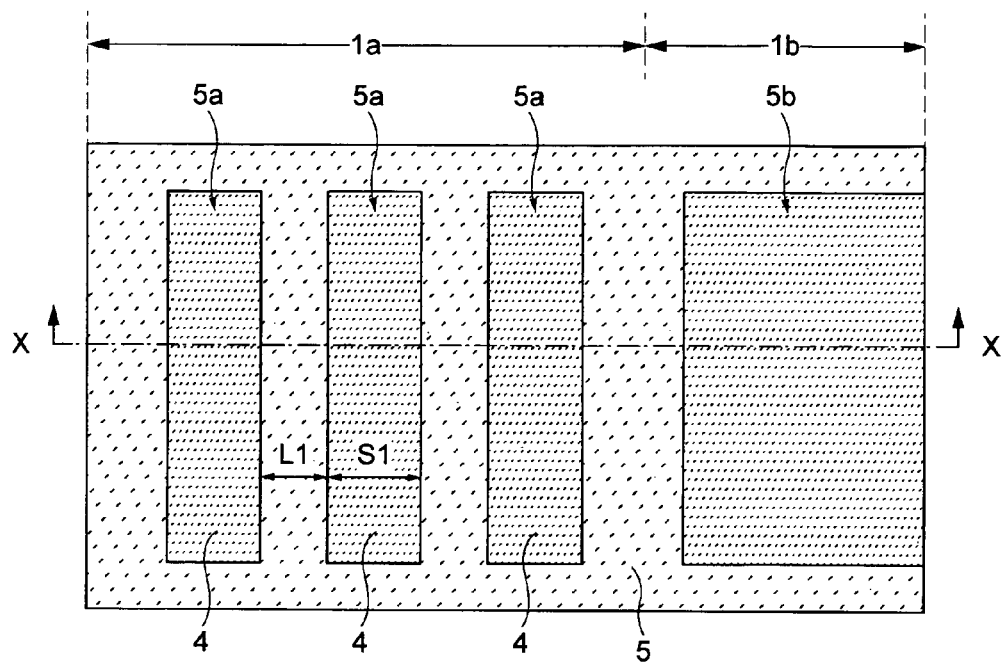
FIGS. 23A and 23B are explanatory diagram of a manufacturing process of a semiconductor device according to a third embodiment of the present invention, where
Figure 23B:
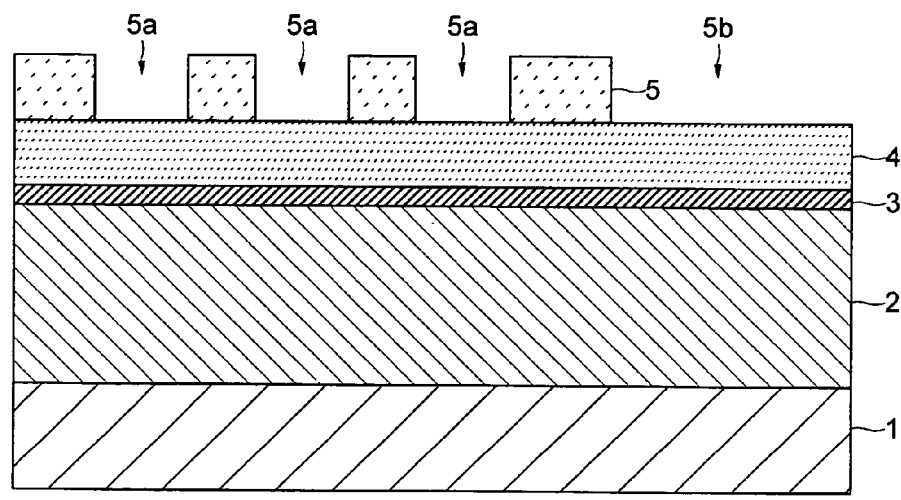

In the manufacturing process of a semiconductor device according to the third embodiment, as shown in FIGS. 23A and 23B, first, the amorphous carbon layer 2, the silicon nitride layer 3, and the polysilicon layer 4 are sequentially deposited on the silicon substrate 1 that is to be processed. Thereafter, the resist pattern 5 is formed for patterning the polysilicon layer 4.

Figure 24A:
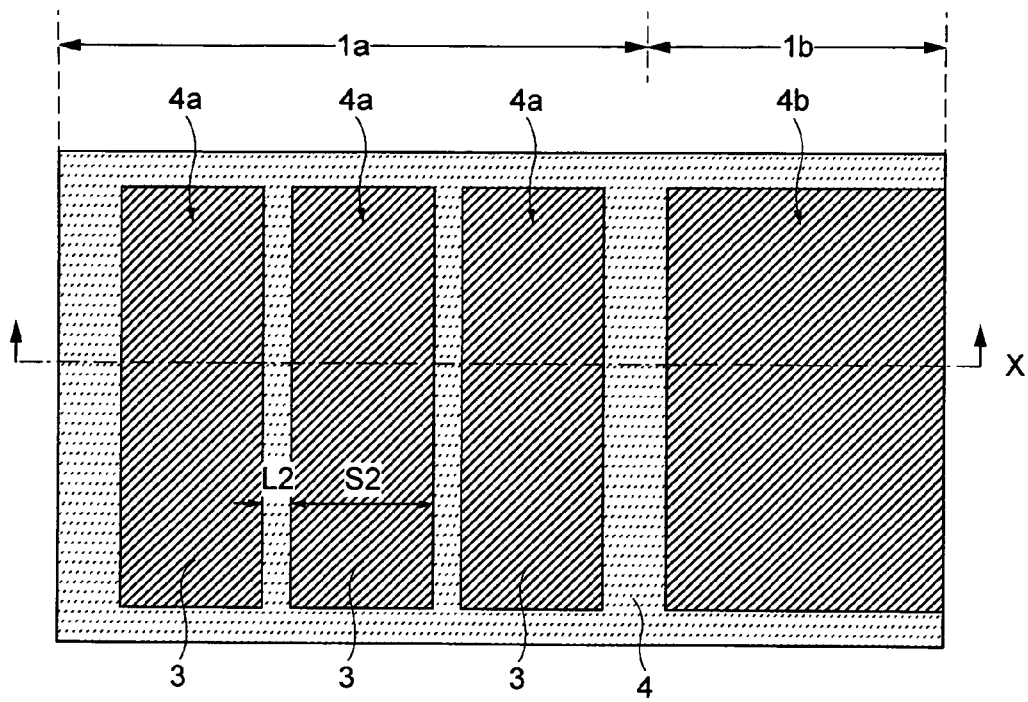
FIGS. 24A and 24B are explanatory diagram of a manufacturing process of a semiconductor device according to the third embodiment of the present invention, where
Figure 24B:
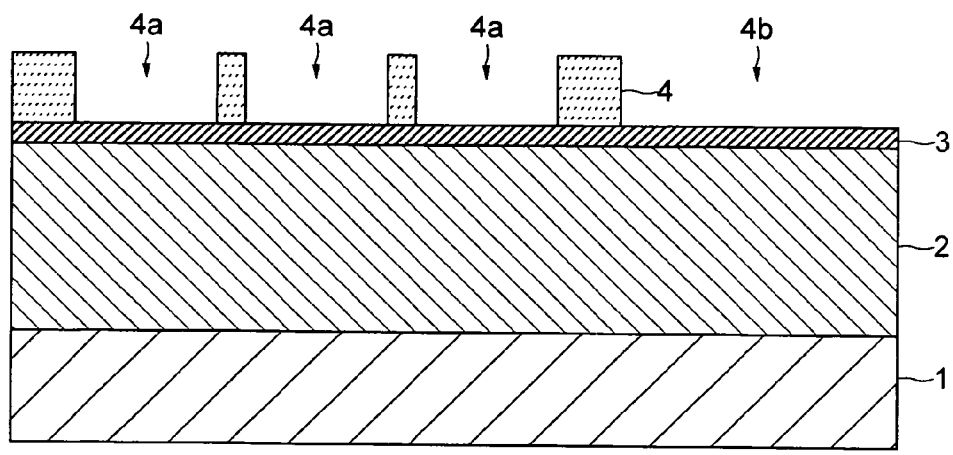

Next, as shown in FIGS. 24A and 24B, the resist pattern 5 is transferred onto the polysilicon layer 4 by dry etching the polysilicon layer 4 using the resist pattern 5 as a mask. Furthermore, a slimming process is also executed that causes the sidewalls of the openings 4a and 4b formed in the polysilicon layer 4 to recede uniformly. In this case, the sidewalls are caused to recede by 10 nm and a pattern having the line width L1 of 50 nm and the space width S1 of 70 nm is changed to a pattern having the line width L2 of 20 nm and the space width S2 of 100 nm. The ratio of the line width L2 and the space S2 is adjusted to be 1:5. This is because, the sidewall spacers having a thickness of approximately 20 nm are formed in a subsequent step on the inner faces of the opening 4b having a width of 90 nm and an interval between adjacent sidewall spacers is kept to approximately 60 nm (20 nm×3).

Figure 25A:
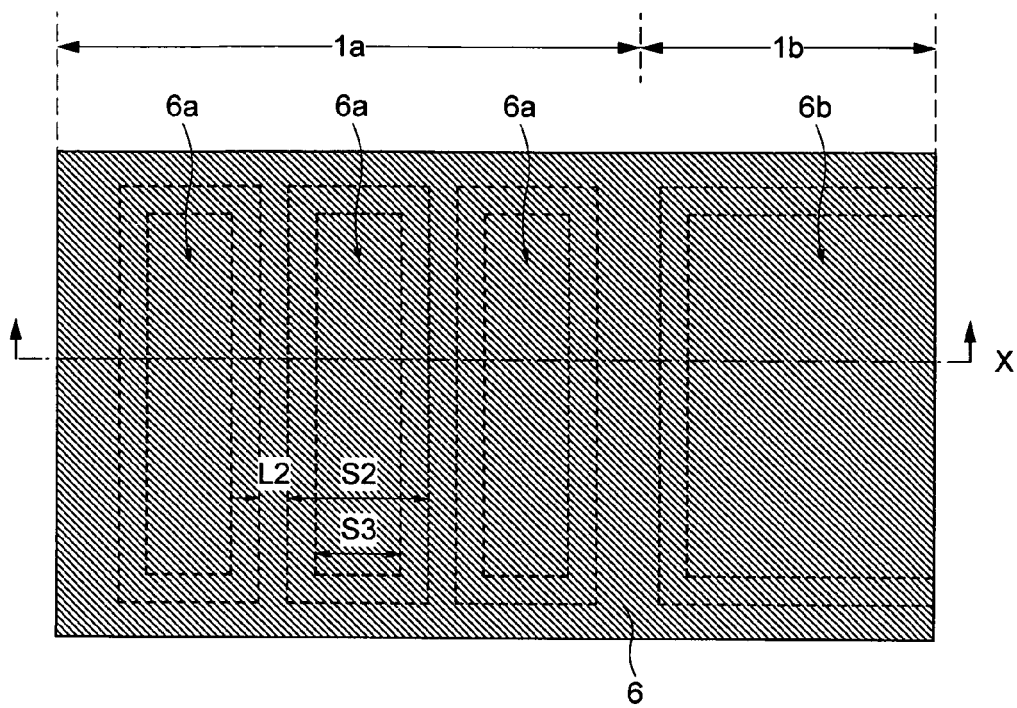
FIGS. 25A and 25B are explanatory diagram of a manufacturing process of a semiconductor device according to the third embodiment of the present invention, where
Figure 25B:
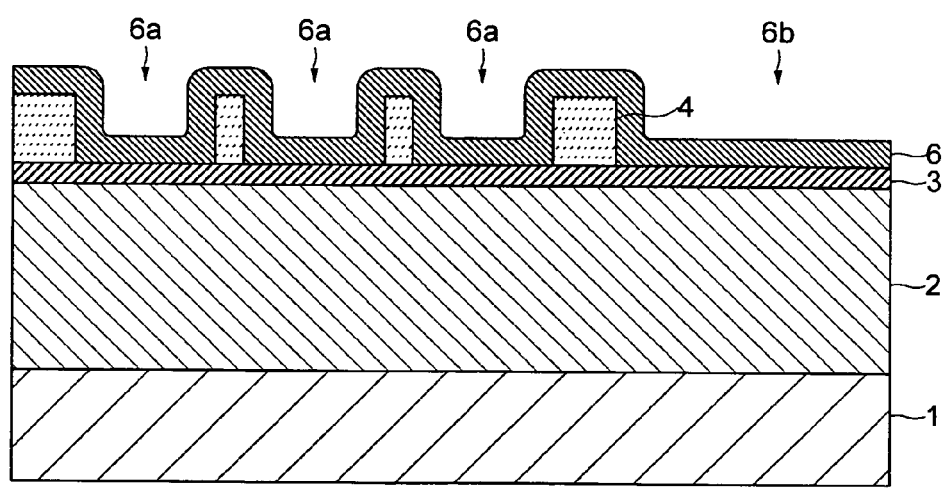

Next, as shown in FIGS. 25A and 25B, a conformal film, for example, the silicon oxide layer 6 is uniformly formed on the polysilicon layer 4 on which the openings 4a and 4b are provided. The silicon oxide layer 6 is used for forming a fine pattern of a size smaller than the resolution limit of lithography. The thickness of the silicon oxide layer 6 is set to 20 nm and the concave portions 6a, respectively, having the width S3 of 60 nm are formed in the silicon oxide layer 6 that is formed on the openings 4a of the polysilicon layer 4.

Figure 26A:
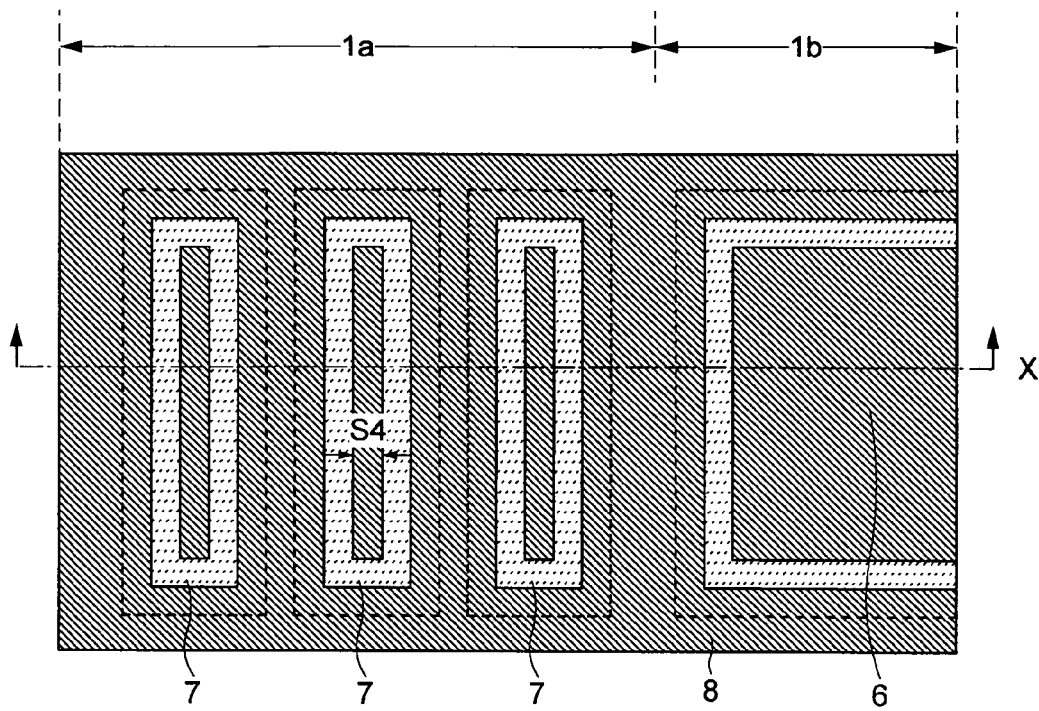
FIGS. 26A and 26B are explanatory diagram of a manufacturing process of a semiconductor device according to the third embodiment of the present invention, where
Figure 26B:
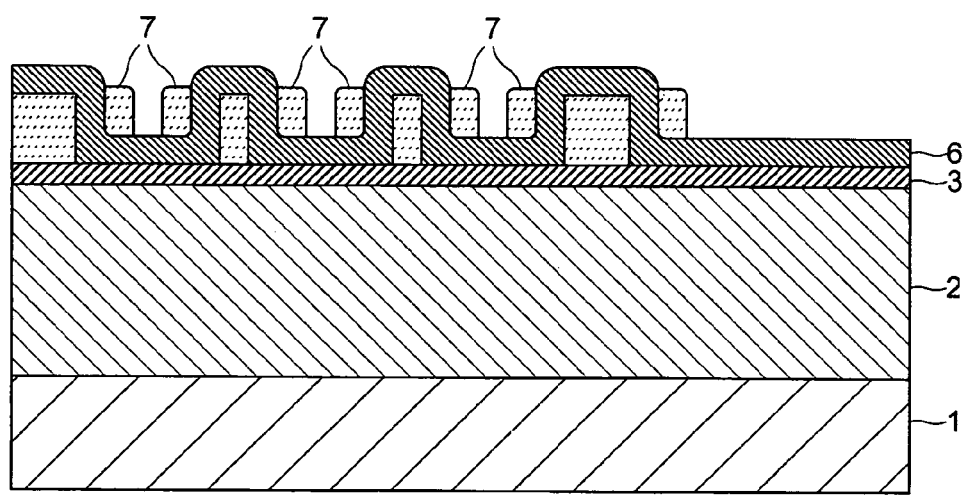

Next, as shown in FIGS. 26A and 26B, the polysilicon layer 7 having a thickness of approximately 20 nm is formed over the silicon oxide layer 6. An embedded hard mask constituted by the polysilicon layer 7 remains, respectively, on both the side surfaces of the concave portions 6a of the silicon oxide layer 6 by etching back the polysilicon layer 7. The polysilicon layer 7 becomes sidewall spacers in ring shape along the inner side surfaces of the concave portion 6a. An interval S4 between the sidewall spacers is approximately 20 nm. A major portion of the polysilicon layer 7 can be removed from the peripheral circuit area 1b; however, the sidewall spacers constituted by the polysilicon layer 7 remain along the inner side surfaces of the concave portion 6b of the silicon oxide layer 6 provided in the peripheral circuit area 1b.

Figure 27A:
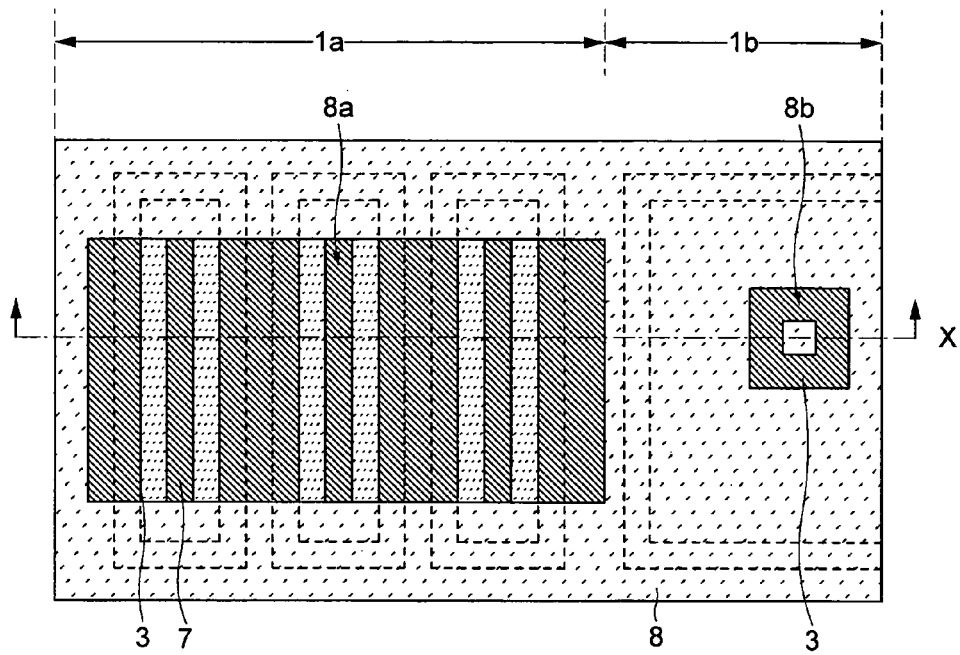
FIGS. 27A and 27B are explanatory diagram of a manufacturing process of a semiconductor device according to the third embodiment of the present invention, where
Figure 27B:
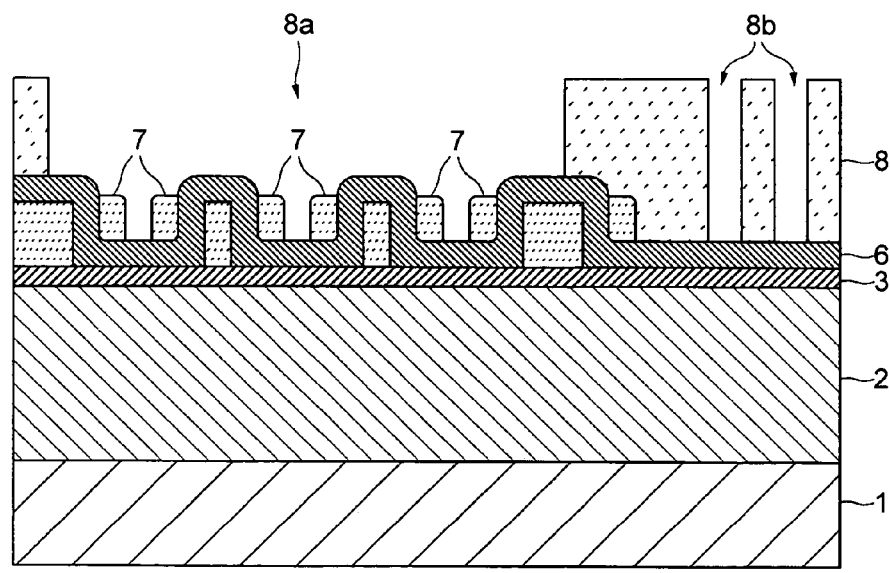

Next, as shown in FIGS. 27A and 27B, the resist pattern 8 is formed using the photolithography technique and covers both edges (looped-back portions) of the sidewall spacers having a loop-shape as well as the sidewall spacers of the polysilicon layer 7 formed in the peripheral circuit area 1b. The resist pattern 8 includes the opening 8a provided in the memory cell array area 1a and the openings 8b provided in the peripheral circuit area 1b.

Figure 28A:
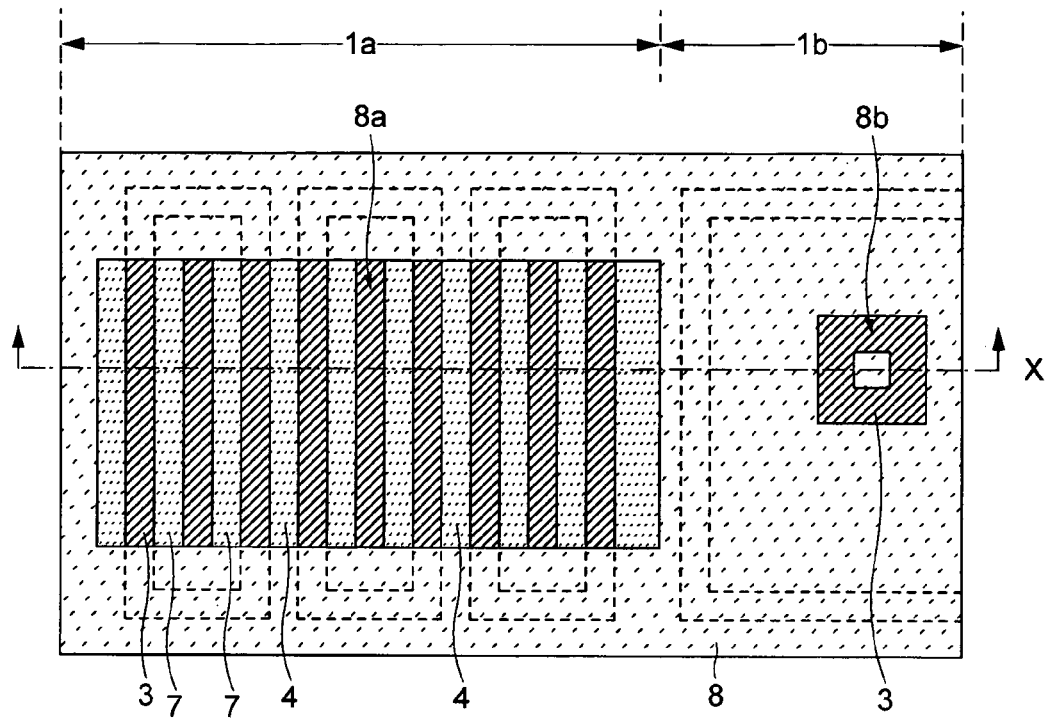
FIGS. 28A and 28B are explanatory diagram of a manufacturing process of a semiconductor device according to the third embodiment of the present invention, where
Figure 28B:
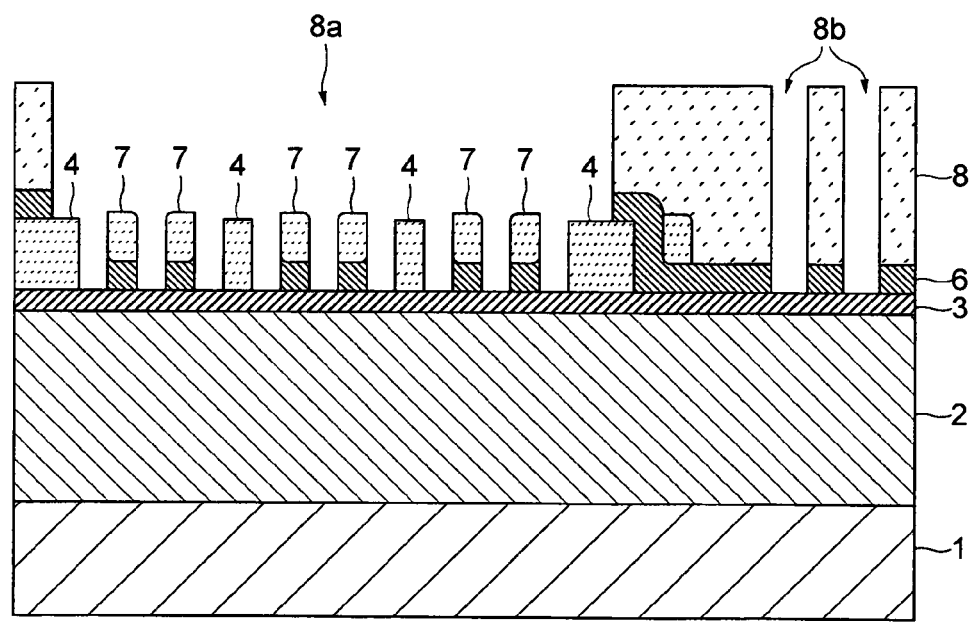

Next, as shown in FIGS. 28A and 28B, the exposed sidewall spacers of the silicon oxide layer 6 are removed from the opening 8a and the exposed silicon oxide layer 6 is removed from the openings 8b used for forming a positioning monitor mark by anisotropic dry etching.

Figure 29A:
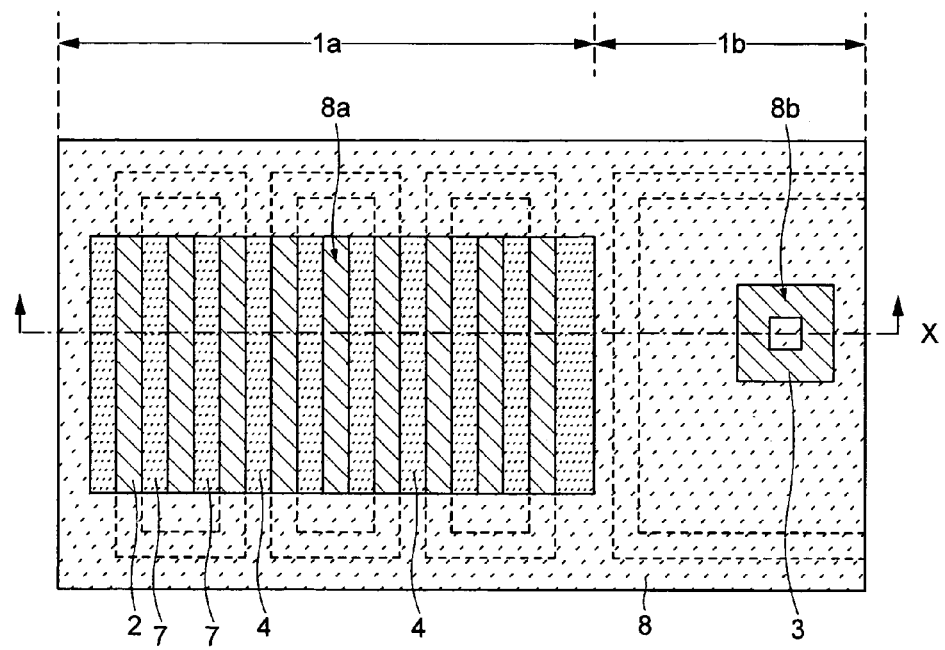
FIGS. 29A and 29B are explanatory diagram of a manufacturing process of a semiconductor device according to the third embodiment of the present invention, where
Figure 29B:
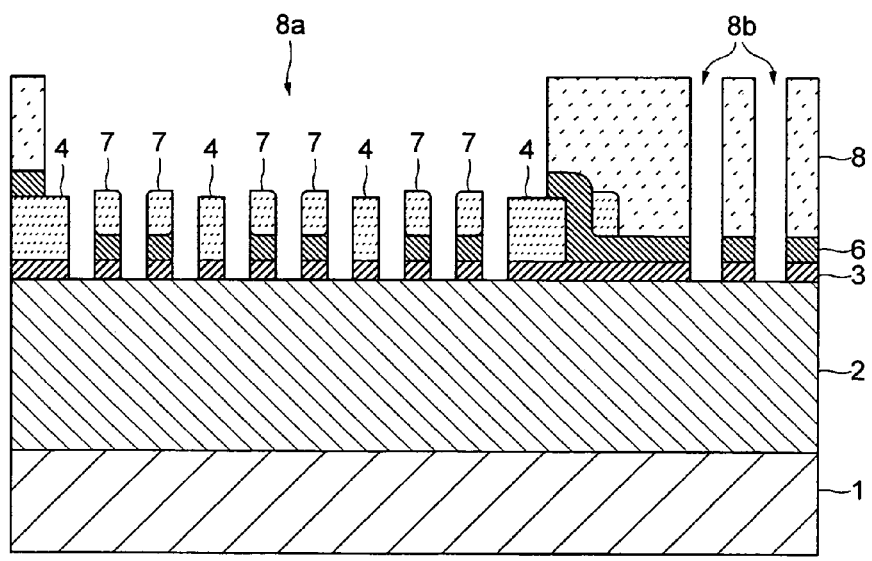

Next, as shown in FIGS. 29A and 29B, the exposed silicon nitride layer 3 is removed by etching. Thus, the line and space pattern that is processed to a size smaller than the resolution limit of photolithography using the sidewall spacers, and a pattern of an arbitrary size exemplified with the positioning monitor mark are combined on the silicon nitride layer 3. As a result, a common hard mask is completed in the memory cell array area 1a and the peripheral circuit area 1b.

Figure 30A:
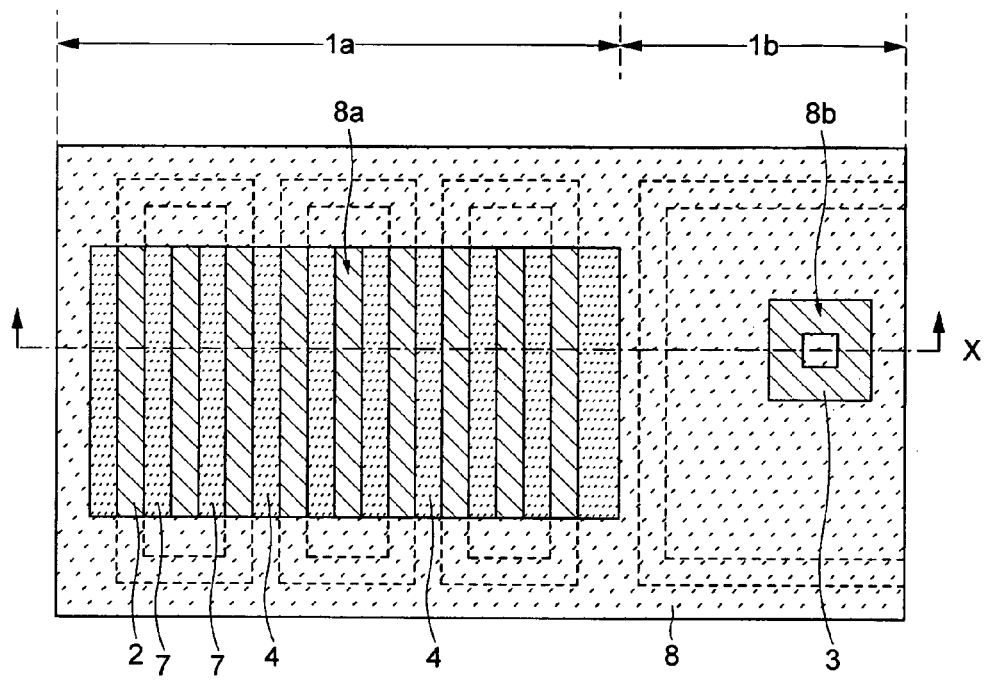
FIGS. 30A and 30B are explanatory diagram of a manufacturing process of a semiconductor device according to the third embodiment of the present invention, where
Figure 30B:
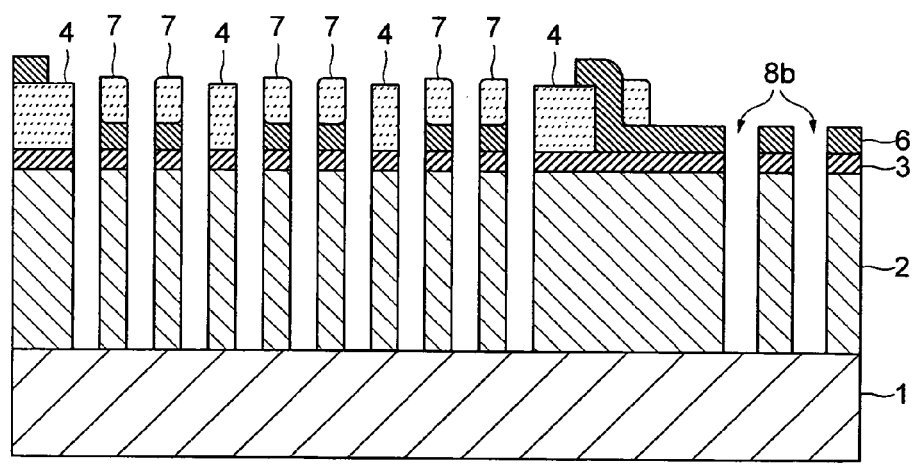

Next, as shown in FIGS. 30A and 30B, the amorphous carbon layer 2 is etched using the silicon nitride layer 3 as a mask.

Figure 31A:
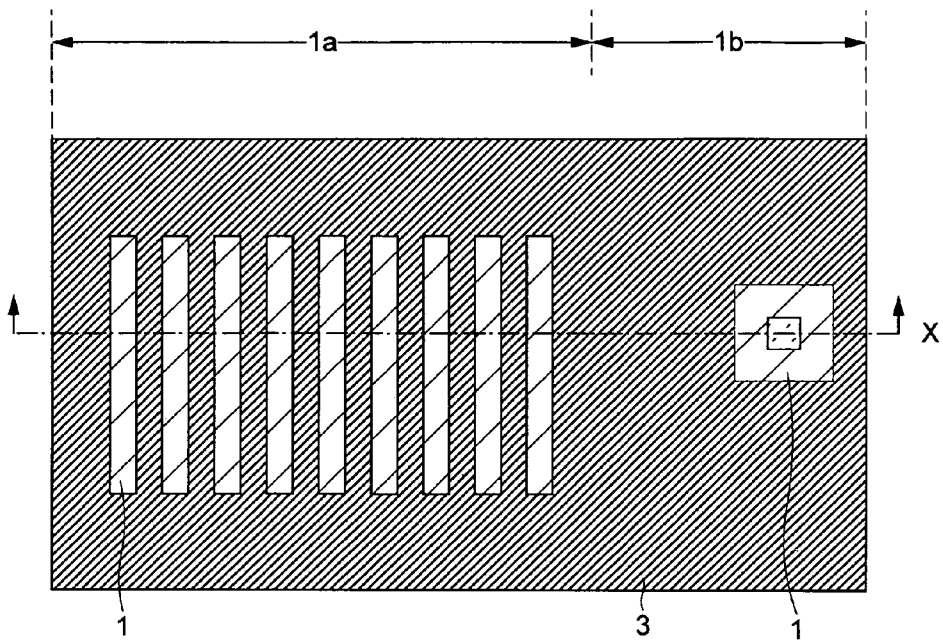
FIGS. 31A and 31B are explanatory diagram of a manufacturing process of a semiconductor device according to the third embodiment of the present invention, where
Figure 31B:
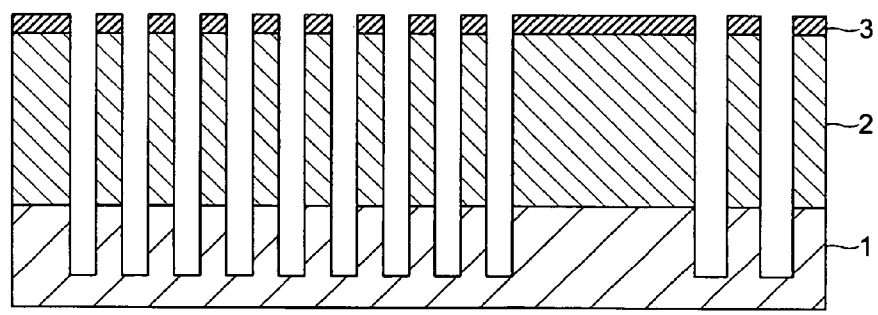

Next, as shown in FIGS. 31A and 31B, the silicon substrate 1 is etched using the amorphous carbon layer 2 as a mask. Thus, the silicon substrate 1 having isolation trenches is completed.

As described above, in the third embodiment, the width of the sidewall core constituted by the polysilicon layer 4 is sufficiently narrowed. Accordingly, the width of the concave portion 6a of the silicon oxide layer 6 is widened and the polysilicon layer 7 embedded in the concave portion 6a is formed as the sidewall spacers. The line and space pattern is formed in the spaces between the sidewall spacers. Therefore, in the third embodiment, in addition to effects that are obtained similarly to those of the first embodiment, a finer line and space pattern can be formed.

It is apparent that the present invention is not limited to the above embodiments, but may be modified and changed without departing from the scope and spirit of the invention.

For example, the first to third embodiments have explained a case where openings are provided as a core pattern for forming sidewall spacers and the sidewall spacers are formed in the inner walls of the openings. However, the sidewall spacers can be formed on outer walls of the openings using the island pattern as the core pattern. In this case, the core pattern can be removed from the peripheral circuit area 1b even when the openings are not provided.

In the first to third embodiments, although a simple rectangular pattern has been exemplified as a core pattern, the entire operation can be performed in the same manner even when a core pattern of an arbitrary shape is used. Note that, also in this case, the width of sidewall spacers needs to be constant.

In the first to third embodiments, a positioning monitor mark has been exemplified as a pattern formed in the peripheral circuit area 1b; however, a pattern of any size and shape can be formed without being limited by the pattern width of a hard mask of sidewall spacers.

The second embodiment has explained a method in which the mask pattern (second pattern) including openings for loop cut and a positioning monitor mark is transferred onto the hard mask (silicon nitride layer) in advance, and the third embodiment has explained a method in which a finer pattern is formed in the spaces between adjacent sidewall spacers for forming a line and spacer pattern. However, in the present invention, the methods explained in the second and third embodiments can be combined. That is, the mask pattern (second pattern) including openings for loop cut and a positioning monitor mark can be transferred onto the hard mask (silicon nitride layer) in advance and a finer pattern can be formed in the spaces between sidewall spacers for forming a line and space pattern.

The sizes of various parts shown in the drawings for explaining the present invention in detail are arbitrarily enlarged or downscaled. Therefore, parts or relative sizes shown in the drawings do no suggest actual sizes thereof.

What is claimed is:

1. A method of manufacturing a semiconductor device comprising:
   forming a first layer on a member to be etched having first and second areas, the first area including a processing area and a non-processed area;
   forming a sidewall core in the first area by patterning the first layer;
   forming a second layer that at least covers side surfaces of the sidewall core;
   forming a third layer over the second layer;
   forming an embedded hard mask that at least covers side surfaces of the second layer by etching back the third layer;
   exposing the member to be etched in an area that neither the sidewall core nor the embedded hard mask is formed within the first area and the member to be etched in an area that a second pattern is to be formed within the second area by etching the second layer; and
   forming a first pattern in the processing area of the first area and the second pattern in the second area by selectively removing the member to be etched having been exposed,
   wherein the exposing the member to be etched is performed by using a mask layer that covers the non-processed area of the first area and an area other than the area that the second pattern is to be formed within the second area and exposes the processing area of the first area and the area that the second pattern is to be formed within the second area.

2. The method of manufacturing a semiconductor device as claimed in claim 1, wherein the mask layer is formed after the embedded hard mask is formed.

3. The method of manufacturing a semiconductor device as claimed in claim 1, wherein the mask layer is provided between the member to be etched and the first layer.

4. The method of manufacturing a semiconductor device as claimed in claim 1, wherein the first pattern having a plurality of line patterns extending in a first direction arranged in parallel to a second direction.

5. The method of manufacturing a semiconductor device as claimed in claim 4, wherein the embedded hard mask is embedded in the second direction across a full width of a concave portion of the second layer formed between two adjacent sidewall cores in the second direction.

6. The method of manufacturing a semiconductor device as claimed in claim 4, wherein the embedded hard mask is provided on both side surfaces of a concave portion of the second layer formed between two adjacent sidewall cores in the second direction.

7. The method manufacturing a semiconductor device as claimed in claim 5, wherein a film thickness of the second layer is equal to a width of the sidewall core in the second direction.

8. The method of manufacturing a semiconductor device as claimed in claim 4, wherein a width of the embedded hard mask in the second direction is equal to a width of the sidewall core in the second direction.

9. The method of manufacturing a semiconductor device as claimed in claim 1, wherein the first layer and the third layer formed in the second area are removed.

10. The method of manufacturing a semiconductor device as claimed in claim 1, wherein the first area is a memory cell array area and the second area is a peripheral circuit area.

11. The method of manufacturing a semiconductor device as claimed in claim 1, wherein a pattern width of the first pattern is smaller than resolution limit of lithography and a pattern width of the second pattern is equal to or greater than the resolution limit of lithography.

12. A method of manufacturing a semiconductor device comprising:
    forming a first layer on a member to be etched having first and second areas, the first area including a processing area and a non-processed area;
    forming a sidewall core in the first area by patterning the first layer;
    forming a second layer that at least covers side surfaces of the sidewall core;
    forming a third layer over the second layer;
    forming an embedded hard mask that at least covers side surfaces of the second layer by etching back the third layer; and
    etching the member to be etched in an area that neither the sidewall core nor the embedded hard mask is formed within the first area and the member to be etched in an area that a second pattern is to be formed within the second area, so that a first pattern in the processing area of the first area and the second pattern in the second area are formed,
    wherein the etching the member to be etched is performed by using a mask layer that covers the non-processed area of the first area and an area other than the area that the second pattern is to be formed within the second area and exposes the processing area of the first area and the area that the second pattern is to be formed within the second area.

13. The method of manufacturing a semiconductor device as claimed in claim 12, wherein the mask layer is formed after the embedded hard mask is formed.

14. The method of manufacturing a semiconductor device as claimed in claim 12, wherein the mask layer is provided between the member to be etched and the first layer.

15. The method of manufacturing a semiconductor device as claimed in claim 12, wherein the first pattern includes a plurality of line patterns extending in a first direction arranged in parallel to a second direction.

16. The method of manufacturing a semiconductor device as claimed in claim 15, wherein the embedded hard mask is embedded in the second direction across a full width of a concave portion of the second layer formed between two adjacent sidewall cores in the second direction.

17. The method of manufacturing a semiconductor device as claimed in claim 15, wherein the embedded hard mask is provided on both side surfaces of a concave portion of the second layer formed between two adjacent sidewall cores in the second direction.

18. The method of manufacturing a semiconductor device as claimed in claim 12, wherein the first layer and the third layer formed in the second area are removed.

19. The method of manufacturing a semiconductor device as claimed in claim 12, wherein the first area comprises a memory cell array area and the second area comprises a peripheral circuit area.

20. The method of manufacturing a semiconductor device as claimed in claim 12, wherein a pattern width of the first pattern is smaller than a resolution limit of lithography and a pattern width of the second pattern is equal to or greater than the resolution limit of lithography.

\* \* \* \* \*